United States Patent
An et al.

(10) Patent No.: US 10,181,830 B2
(45) Date of Patent: Jan. 15, 2019

(54) METHOD AND APPARATUS FOR PLAYING CONTENT

(71) Applicant: Samsung Electronics Co., Ltd., Gyeonggi-do (KR)

(72) Inventors: Jinwan An, Daegu (KR); Yonggil Han, Gyeongsangbuk-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 229 days.

(21) Appl. No.: 14/266,475

(22) Filed: Apr. 30, 2014

(65) Prior Publication Data

US 2014/0321671 A1  Oct. 30, 2014

(30) Foreign Application Priority Data

Apr. 30, 2013 (KR) .................. 10-2013-0047871

(51) Int. Cl.
| | |
|---|---|
| *H03G 3/02* | (2006.01) |
| *G06F 3/0484* | (2013.01) |
| *G06F 3/0487* | (2013.01) |
| *G06F 3/0488* | (2013.01) |

(52) U.S. Cl.
CPC ............ *H03G 3/02* (2013.01); *G06F 3/0487* (2013.01); *G06F 3/0488* (2013.01); *G06F 3/04847* (2013.01); *H04S 2400/13* (2013.01)

(58) Field of Classification Search
CPC ........ G06F 3/165; G06F 3/0488; G06F 3/162; G06F 3/04847; G06F 3/017; G06F 3/0487; H03G 3/02
USPC .................. 715/716, 762, 808, 863; 381/109
See application file for complete search history.

(56) References Cited

U.S. PATENT DOCUMENTS

| | | | | |
|---|---|---|---|---|
| 6,595,781 B2* | 7/2003 | Sutton | ...................... | G09B 5/00 434/276 |
| 6,894,680 B1* | 5/2005 | Sasaki | .................. | G06F 3/04883 178/18.01 |
| 7,509,588 B2* | 3/2009 | Van Os | ............... | G06F 3/04817 345/156 |
| 7,804,495 B2* | 9/2010 | Ohta | ....................... | H04B 1/202 178/18.01 |
| 9,477,439 B2* | 10/2016 | Lee | .......................... | G06F 3/165 |

(Continued)

FOREIGN PATENT DOCUMENTS

| | | | | | |
|---|---|---|---|---|---|
| CN | 102118507 | * | 3/2009 | ............ | H04M 1/725 |
| CN | 102118507 | * | 3/2011 | ............ | H04M 1/725 |

(Continued)

*Primary Examiner* — Oyesola C Ojo

(57) ABSTRACT

A method for operating a user device includes playing a media content on a screen, detecting a user input for lowering a volume of the media content, and decreasing the volume of the media content in response to the user input, determining whether a user input enters a play control zone after the detection of the user input for lowering the volume, and performing a pause of the media content in response to the user input entering the play control zone. A user device includes a touch screen configured to receive a user input for controlling a volume of the media content, and a controller configured to decrease the volume of the media content in response to a user input for decreasing a volume during playing of the media content, and perform a pause of the media content when the user input enters a play control zone.

14 Claims, 16 Drawing Sheets

(56) References Cited

U.S. PATENT DOCUMENTS

| | | | |
|---|---|---|---|
| 2005/0266961 A1* | 12/2005 | Shum | A63B 71/0622 482/8 |
| 2008/0122796 A1* | 5/2008 | Jobs | G06F 3/0488 345/173 |
| 2008/0190266 A1* | 8/2008 | Kim | G06F 3/0488 84/602 |
| 2009/0177966 A1* | 7/2009 | Chaudhri | G06F 1/1626 715/716 |
| 2010/0107102 A1* | 4/2010 | Wang | G06F 9/4443 715/771 |
| 2010/0235661 A1* | 9/2010 | Lu | G06F 3/162 713/321 |
| 2011/0199322 A1* | 8/2011 | Langlois | G06F 3/04817 345/173 |
| 2013/0006404 A1* | 1/2013 | Pitkanen | G06F 3/165 700/94 |
| 2014/0068434 A1* | 3/2014 | Filev | G06F 3/0484 715/716 |
| 2014/0123190 A1* | 5/2014 | Song | H04N 21/482 725/40 |

FOREIGN PATENT DOCUMENTS

| | | | | |
|---|---|---|---|---|
| JP | 2006065981 A | * | 3/2006 | G11B 20/10 |
| KR | 10-2006-0099764 | | 9/2006 | |

* cited by examiner

METHOD AND APPARATUS FOR PLAYING CONTENT

CROSS-REFERENCE TO RELATED APPLICATION AND CLAIM OF PRIORITY

The present application is related to and claims the benefit under 35 U.S.C. § 119(a) of a Korean patent application 10-2013-0047871 filed on Apr. 30, 2013 in the Korean Intellectual Property Office, the entire disclosure of which is hereby incorporated by reference.

TECHNICAL FIELD

The present disclosure relates to a method and apparatus for processing a function of a user device, and more particularly, to a method and apparatus for processing a function of a user device which is capable of simultaneously controlling a volume and a play of media content in response to a user input while playing the media content in the user device.

BACKGROUND

Recently, along with development of digital technologies, various user devices capable of processing communication and personal information, such as a mobile communication terminal, a personal digital assistant (PDA), an electronic organizer, a smartphone, and a tablet personal computer (PC), and the like are being introduced. The user devices do not remain in their unique areas, and are reaching a mobile convergence phase which covers the areas of other terminals. For example, the user device may have various functions such as a calling function such as a voice call and a video call, a message transmission and reception function such as a short message service (SMS)/multimedia message service (MMS) and an e-mail, a navigation function, a photographing function, a broadcast play function, a media (video and music) play function, an Internet function, a messenger function, and a social network service (SNS) function.

Recently, as compression technologies for media content such as a video file and a music file has been developed, the size of the media content gradually becomes smaller, and many media content can be stored in a memory used in the user device. Furthermore, as the media content is widely distributed, the number of users who listen to and view media content in the user device is on the increase. The user may control the volume of media content according to the surrounding environment while listening to and viewing the media content. For example, the user may add or decrease the volume by operating a hardware-type button or a software-type button which has been set for volume control while playing media content.

Furthermore, the volume control in the user device is a function of adjusting the sound of the user device, and the volume is adjusted according to the set volume control zone (e.g., 0 to 10, 0 to 15, etc.). Furthermore, the volume turn-off (volume="0") section (e.g., a section where the volume value is set to "0" in response to the user input) in the volume control section represents a section where the sound of the played media content is not outputted through a speaker. The user may frequently need to decrease the sound by the maximum amount (e.g., volume="0") if necessary (e.g., when there is a need for a conversation with another person) while the user views or listens to media content by playing the media content.

Generally, if the user sets the volume of the played media content to zero, such situation may mean that the user may do something else rather than viewing/listening to the media content. However, in this case, since the user has not explicitly inputted the play-related function of the media content (e.g., a pause, play, stop, etc.), the play of the media content is continually performed even if sound is not outputted. Hence, even in the situation where the user does not view/listen to media content, unnecessary battery consumption due to the continuous play operation may occur, and when media content is received and played from the exterior (e.g., the play of the streaming), unnecessary data fees may be charged. Furthermore, when the user attempts to listen to or view the media content again after temporarily adjusting the volume to zero to cope with another situation, it is difficult to check how much the user has viewed or listened to, and the media content need to be inconveniently returned back to the previous viewing/listening time point.

SUMMARY

To address the above-discussed deficiencies, it is a primary object to provide a method and apparatus for processing a function of a user device capable of simultaneously operating the play-related function in response to the volume control of the media content which are being played in the user device.

In various embodiments of the present disclosure, the user device may include all electronic devices which use an application processor (AP), a graphic processing unit (GPU), and a central processing unit (CPU), such as all information and communication devices, multimedia devices, and their application devices.

The present disclosure further provides a method and apparatus for processing the function of the user device which is capable of simultaneously operating a pause function of media content in response to the user input for controlling the volume.

The present disclosure further provides a method and apparatus for processing the function of the user device which is capable of operating the multi-function (e.g., the volume control and play function control) in response to one user input for the volume control.

The present disclosure further provides a method and apparatus for processing the function of the user device which may automatically perform pause for media content, which are being played, in response to the user input which sets a volume to zero (volume="0"), and may automatically play the media content in response to the user input of increasing the volume from the volume zero state.

The present disclosure further provides a method and apparatus for processing the function of the user device which is capable of simultaneously performing the volume turn-off control and processing a play-related function of the media content by using a volume turn-off (volume="0") section in the volume control section of the media content.

The present disclosure further provides a method and apparatus for processing the function of the user device which may define a play control zone related with a play function in the volume control section of the media content, and may simultaneously process the function related with the play in response to the volume control of the media content.

The present disclosure further provides a method and apparatus for processing the function of the user device which may control a sound output according to the volume turn-off section when entering a play control zone from the volume control section of the media content, and may simultaneously process the pause, stop, or play end of the media content according to the entry level of the play control zone.

The present disclosure further provides a method and apparatus for processing the function of the user device which may enhance user convenience and usability of the user device by implementing the optimal environment for supporting the multi-function of simultaneously controlling the volume and the play function in the user device.

In accordance with an aspect of the present disclosure, a method of processing a function of a user device includes playing a media content, decreasing a volume of the media content in response to a user input of volume down, determining whether the user input enters a play control zone; and controlling a pause of the media content in response to the user input of entering the play control zone.

In accordance with another aspect of the present disclosure, a method of processing a function of a user device includes playing a media content in response to execution of the media content; adjusting a volume of output sound of the media content in response to a user input, and controlling a preset play function of the media content in response of the user input of adjusting the volume.

In accordance with another aspect of the present disclosure, there is provided a computer-readable recording medium on which a program for executing the method in a processor is recorded.

In accordance with another aspect of the present disclosure, a user device includes a touch screen configured to display a screen according to a play of a media content and receive a user input for controlling a volume or function of the media content, and a controller configured to decrease a volume of the media content in response to the user input of decreasing a volume during the play of the media content, and control a pause of the media content when the user input enters a play control zone.

In accordance with another aspect of the present disclosure, a user device includes a computer-implemented content player configured to play a media content in response to execution of the media content and display a screen of the played media content, a computer-implemented volume controller configured to adjust output sound of the media content in response to a user input, and a computer-implemented function processor configured to control a play function of the media content in response to a user input of adjusting the volume.

In accordance with another aspect of the present disclosure, there is provided a computer-readable recording medium having recorded a program that, when executed by one or more processors, causes the one or more processors to perform acts including displaying the played media content on a screen, adjusting a volume of output sound of the media content in response to a user input, and performing a preset play-related function of the media content in response to the user input of adjusting the volume.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
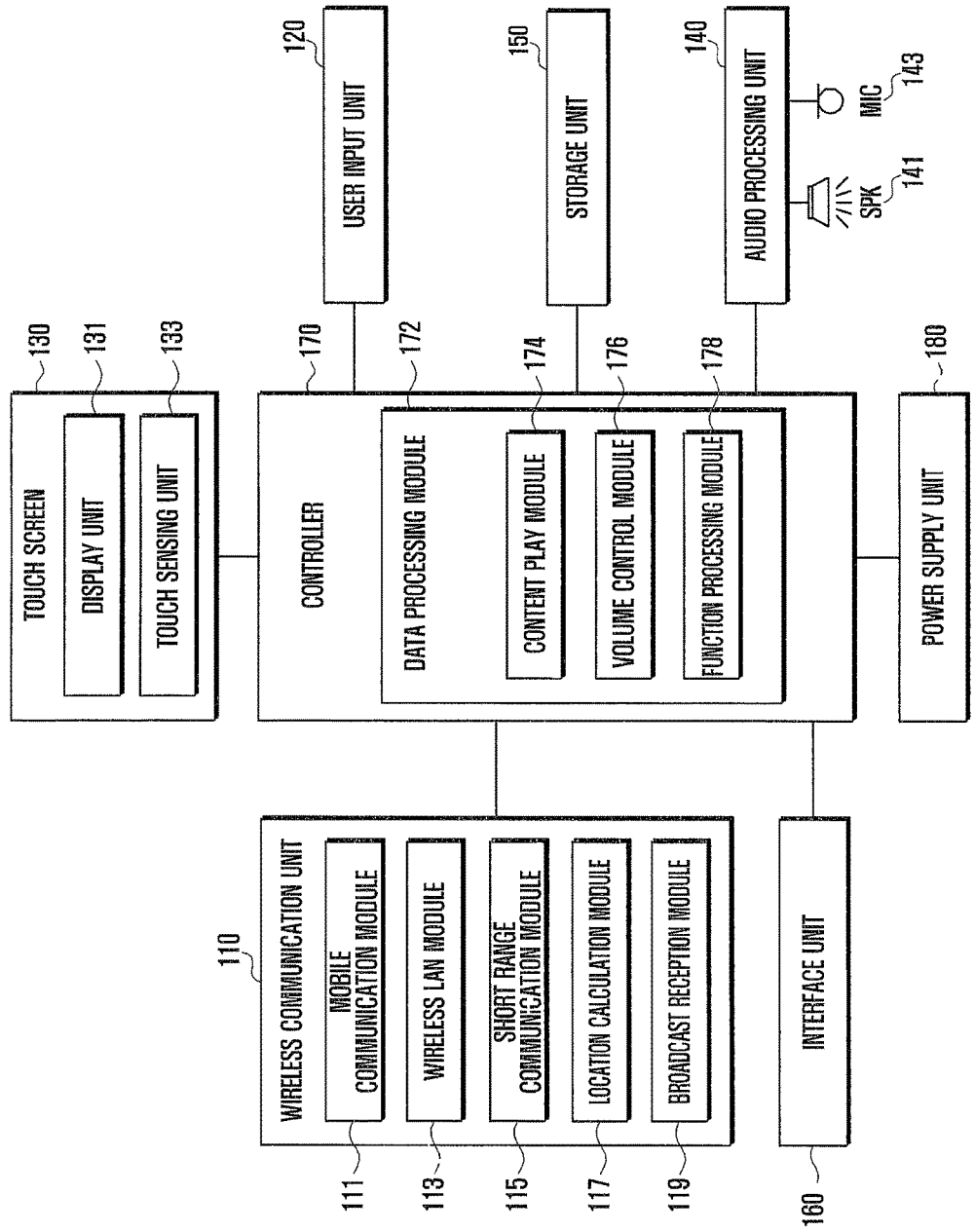
FIG. 1 schematically illustrates the configuration of a user device according to an embodiment of the present disclosure.
Figure 2:
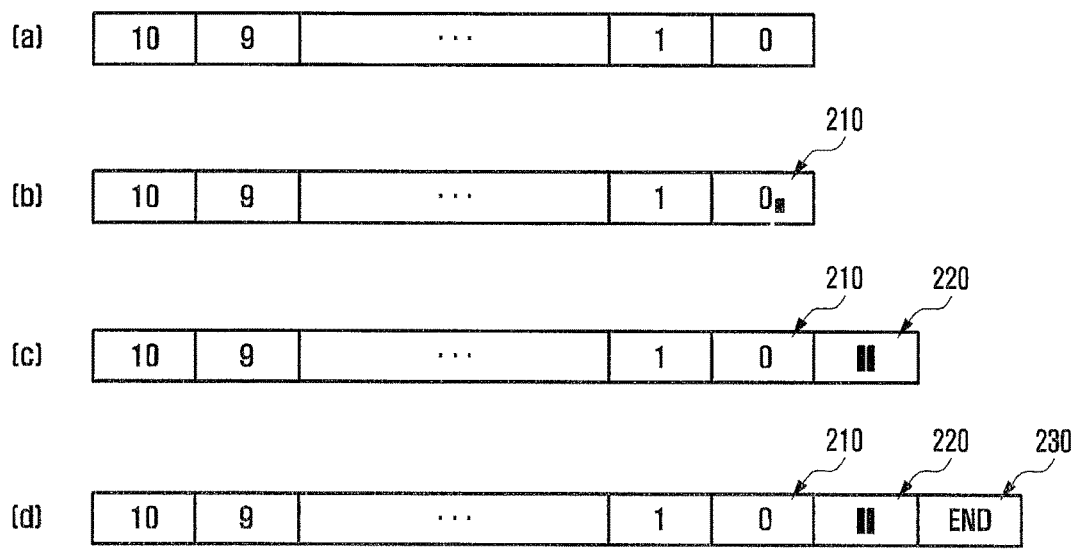
FIGS. 2A to 2D schematically illustrate volume control zones which are provided by a user device according to embodiments of the present disclosure.

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic devices. Exemplary embodiments of the present disclosure are described with reference to the accompanying drawings in detail. The same reference numbers are used throughout the drawings to refer to the same or like parts. Detailed descriptions of well-known functions and structures incorporated herein may be omitted to avoid obscuring the subject matter of the present disclosure.

The present disclosure relates to a method and apparatus for processing a function in a user device. According to various embodiments of the present disclosure, a multi-function, which enables a second function of the user device to be operated simultaneously in response to the user input which controls a first function of the user device, may be operated. For example, according to various embodiments of the present disclosure, the play-related function is operated simultaneously in response to the user input for adjusting the volume of the media content which are being played in the user device. That is, according to an embodiment of the present disclosure, the volume control and play function control may be operated simultaneously in response to the user's single input.

In various embodiments of the present disclosure, the media content may include moving image data or music data stored in the user device, and may include moving image data or music data which is displayed in a streaming type by accessing to an external server.

An embodiment of the present disclosure may define a volume control section for volume control of media content and a play control zone for additionally controlling the play-related function in the volume control zone. In an embodiment of the present disclosure, the play control zone may be defined to be overlapped in the volume control section, or may be implemented separately from the volume control section in a recognized area. According to an embodiment of the present disclosure, the function related with the play may be set to be operated simultaneously in response to the volume control of the media content by the volume control section and the play control zone. According to an embodiment of the present disclosure, in the volume control section, the volume turn-off (volume=0) section may be set simultaneously as the play control zone, and a level lower than the volume turn-off section may be additionally defined so that at least one play control zone may be set.

In an embodiment of the present disclosure, when the volume value is set to zero in response to the user input or after the volume value is set to zero and then proceeds to a lower level, the play-related function (e.g., a pause, a stop, etc.) of the media content, which are being played, may be controlled. Furthermore, in an embodiment of the present disclosure, as in the former case, when the play-related function of the media content is operated in the volume turn-off section (e.g., a pause), the volume value may be set to a value greater than zero (e.g., volume>0), or, as in the latter case, when the play-related function is operated in a situation when the volume is lower than zero (e.g., a pause), the play of the media content may be controlled when the volume value is set to zero in response to the user input. According to an embodiment of the present disclosure, the play of the media content may be paused (or stopped) in response to the user input of decreasing the volume value, and the play of the media content may be resumed in response to the user input of increasing the volume value in a state in which the media content is paused (or stopped).

Likewise, in an embodiment of the present disclosure, the media content may be easily stopped through decreasing the volume even in the volume "0" by defining the play control section which is in the volume "0" or a lower level than the volume "0". According to an embodiment of the present disclosure, the user does not listen to a song in volume "0" or does not view moving images, but usually does something else. Hence, when the user desires to set the volume to "0" and to suitably stop a song or a video, it is possible to quickly stop the song or the video through a user input of setting the volume to "0" or entering a level lower than the volume "0".

Hereinafter, the configuration of the user device, and a method of controlling the operation of the same according to an embodiment of the present disclosure will be discussed with reference to the attached drawings. The configuration of the user device and a method of controlling the operation thereof according to an embodiment of the present disclosure are not limited to the description below, and may be applied to various embodiments based on the embodiments described below.

FIG. 1 schematically illustrates the configuration of a user device according to an embodiment of the present disclosure.

Referring to FIG. 1, the user device of the present disclosure can include a wireless communication unit 110, a user input unit 120, a touch screen 130, an audio processing unit 140, a storage unit 150, an interface unit 160, a controller 170, and a power supply unit 180. In the embodiments of the present disclosure, the components illustrated in FIG. 1 are not essential elements of the user device, and thus it is possible to include more or fewer components. For example, when the user device supports a photographing function, a camera module can be further included. Further, when the user device does not support a broadcast reception or play function, some modules such as a broadcast reception module 119 of the wireless communication unit 110 can be omitted.

The wireless communication unit 110 can include one or more modules which enables wireless communication between the user device and a wireless communication system or between the user device and another user device. For example, the wireless communication unit 110 can include a mobile communication module 111, a wireless local area network (WLAN) module 113, a short range communication module 115, a location calculation module 117, and a broadcast reception module 119.

The mobile communication module 111 can transmit and receive wireless signals to and from at least one of a base station, an external terminal, or various servers such as an integration server, a provider server, a content server, an Internet server, and a cloud server. The wireless signals can include a voice call signal, a video call signal, or various forms of data according to transmission and reception of a text/multimedia message. The mobile communication module 111 can download media content by accessing to various servers under control of the controller 170. Furthermore, the mobile communication module 111 can receive specific media content by streaming by accessing to various servers under control of the controller 170.

The wireless LAN module 113 indicates a module for connecting to wireless Internet and forming a wireless LAN link with other user device, and can be internally or externally mounted on the user device. The wireless Internet technologies can include Wi-Fi, Wireless broadband (Wibro), World Interoperability for Microwave Access (Winmax), High Speed Downlink Packet Access (HSDPA), and the like. The wireless LAN (WLAN) module 113 can receive various media content by downloading or streaming when wireless LAN communication is connected with various servers. Furthermore, the WLAN module 113 can transmit or receive various media content according to the user's selection to or from other user device when a WLAN link is formed with other user device. Such a WLAN module 113 can always maintain a turned-on state or can be turned on according to the user's setting or input.

The short range communication module 115 indicates a module for a short range communication. The short range communication technology can include Bluetooth™, Bluetooth Low Energy™ (BLE), Radio Frequency Identification (RFID), Infrared Data Association (IrDA), Ultra Wideband (UWB), ZigBee™, and Near Field Communication (NFC). Furthermore, the short range communication module 115 can transmit or receive media content according to the user's selection to or from another user device when a short range communication is connected with another user device. Such a short range communication module 115 can always maintain a turned-on state or can be turned on according to the user's setting or input.

The location calculation module 117 is a module for obtaining the location of the user device, and can include a global positioning system (GPS) as a representative example. The location calculation module 117 can calculate distance information from three or more base stations and accurate time information, and then calculate three-dimensional current location information according to the latitude, longitude, and altitude by applying trigonometry to the calculated information. Furthermore, the location calculation module 117 can calculate location information by continually receiving location information of the user device in real time from three or more satellites. The location information of the user device can be obtained by various methods.

The broadcast reception module 119 can receive broadcast signals (e.g., a TV broadcast signal, a radio broadcast signal, a data broadcast signal, etc.) and/or the broadcast-related information (e.g., a broadcast channel, a broadcast program or information related with the broadcast service provider, etc.) from an external broadcast management server through a broadcast channel (e.g., a satellite broadcast channel, a ground wave broadcast channel, etc.).

The user input unit 120 can generate input data for controlling operation of the user device in response to the user input. The user input unit 120 can include a keypad, a dome switch, a touch pad (capacitive/resistive type), a jog wheel, a jog switch, a sensor (e.g., a voice recognition sensor, a proximity sensor, an illumination sensor, an acceleration sensor, a gyro sensor, etc.), and a volume control key. Further, the user input unit 120 can be implemented in an external button of the user device, and some buttons can be implemented with a touch panel. The user input unit 120 can receive a user input for the execution and the operation of the media content, and generate a corresponding input signal. Further, the user input unit 120 (e.g., a volume control key) can receive a user input for volume control within the volume control section during the play of the media content, or a user input of entering the play control zone, and generate a corresponding input signal.

The touch screen 130 is an input and output means for simultaneously performing an input function and a display function, and can include a display unit 131 and a touch sensing unit 133. In particular, in an embodiment of the present disclosure, the touch screen 130 can display various screens (e.g., a media content play screen, a screen for call sending, a messenger screen, a game screen, a gallery screen, etc.) according to the operation of the user device through the display unit 131. Further, if a user's touch event by the touch sensing unit 133 is inputted during the screen display through the display unit 131, the touch screen 130 can transmit an input signal according to the touch screen to the controller 170. Then, the controller 170 can distinguish the touch event, and can control the performance of operation according to the touch event.

The display unit 131 can display (output) information which is processed in the user device. For example, when the user device is in a calling mode, the call-related user interface (UI) or graphic user interface (GUI) can be displayed. Further, when the user device is in a video call mode or a photographing mode, the display unit 131 can display a photographed or/and received image, UI or GUI. In particular, in an embodiment of the present disclosure, the display unit 131 can display a related play screen (e.g., an image, UI, or GUI) according to the play of media content. Further, in response to the user input of adjusting the volume while displaying the play screen according to the play of the media content, the display unit 131 can display a volume control item which is changed according to the user input through a certain area of the play screen. Further, the display unit 131 can support a screen display by a landscape mode or a screen display by a portrait mode according to the rotation direction (or orientation) of the user device, and a screen conversion display according to the change between the landscape mode and the portrait mode. A screen example of the display unit 131 operated in the present disclosure will be described later.

The display unit 131 can include at least one of a liquid crystal display (LCD), a thin film transistor (TFT) LCD, a light emitting diode (LED), an organic LED (OLED), an active matrix OLED (AMOLED), a flexible display, a bended display, or a 3D display. Some of the above displays can be implemented with a transparent display which is formed as a transparent type or an optical transparent type so that an external side is visible.

The touch sensing unit 133 can be placed on the display unit 131, and can sense the user's touch event input of contacting the surface of the touch screen 130, for example, a touch-based long press input, a touch-based short press input, a single-touch based input, a multi-touch based input, a touch-based gesture (e.g., a drag, etc.). When sensing the user's touch event on the surface of the touch screen 130, the touch sensing unit 133 can detect the coordinates in which the touch event is generated, and can transmit the detected coordinates to the controller 170. The controller 170 can perform a function corresponding to the area where a touch event is generated by a signal which is transmitted from the touch sensing unit 133.

The touch sensing unit 133 can receive a touch event for volume control in a state in which the play screen of the media content is displayed through the display unit 131. According to an embodiment of the present disclosure, the touch sensing unit 133 can receive a touch event for increasing the volume or a touch event for decreasing the volume within the volume control section in a state in which the play screen of the media content is being displayed on the display unit 131. Further, the touch sensing unit 133 can receive a touch event in which the volume control section is overlapped with the play control zone, or a touch event of entering a play control zone beyond the volume control section.

Such a touch sensing unit 133 can be configured to convert a change of a pressure applied to a specific region of the display unit 131 or a capacitance generated on a specific region of the display unit into an electrical input signal. The touch sensing unit 133 can be configured to detect also the pressure at the time of a touch depending on the applied touch method as well as the touched location and area. When there is a touch input for the touch sensing unit 133, signal(s) corresponding to the touch input can be transmitted to a touch controller (not shown). The touch controller (not shown) can process the signal(s) and transmit relevant data to the controller 170. Thus, the controller 170 can recognize which area of the touch screen 130 has been touched.

The audio processing unit 140 can perform the function of transmitting an audio signal received from the controller 170 to the speaker (SPK) 141, and transmitting an audio signal such as a voice received from the microphone (MIC) 143 to the controller 170. The audio processing unit 140 can convert voice/sound data into audible sounds and output the audible sounds through the speaker 141 under control of the controller 170, and can transmit audio signals such as a voice received from the microphone into digital signal and transmit the digital signal to the controller 170.

The speaker 141 can output audio data which has been received from the wireless communication unit 110 or which has been stored in the storage unit 150 in a calling mode, a message mode, a messenger mode, a recording voice (video) mode, a voice recognition mode, a broadcast reception mode, and a media content (e.g., a video, a music, and the like) play mode, and the like. The speaker 141 can output sound signal related with the function performed in the user device (e.g., a volume control, call connection reception, call connection transmission, photographing, media content file play, and the like).

The microphone 143 can receive external sound signal in a calling mode, a message mode, a messenger mode, a recording voice (video) mode, and a voice recognition mode, and process the sound signals as electric sound data. In a calling mode, the processed voice data can be converted into a form which is able to be transmitted to the mobile communication base station through the mobile communication module 111 and be outputted. Various noise removing algorithms for removing a noise which is generated in the process of receiving external sound signal can be implemented.

The storage unit 150 can store a program for processing and controlling the controller 170, and can perform a function of temporarily storing inputted/outputted data, for example, contact information, a message, chatting data, media content (e.g., music, video, image), and a set volume value. The storage unit 150 can simultaneously store the frequency of use according to operation of the function of the user device (e.g., the frequency of use of media content, the frequency of use of the volume value within the volume control section, or the like), the importance, and the priority. The storage unit 150 can store data related to sound and vibration of various patterns which are outputted in response to the touch input on the touch screen 130.

The storage unit 150 can continually or temporarily store the operating system (OS) of the user device, a program related with the input or display control operation which uses the touch screen 130, a program related with the volume control and play-related function control operation in the media content execution environment, and data generated by operation of each program. Further, the storage unit 150 can store a volume control section, a play control zone, and a mapping relation between the volume turn-off section and the play control zone within the volume control section (e.g., "volume turn-off section=play control zone", "volume turn-off section>play control zone", or the like). In the embodiments of the present disclosure, the volume control section, the play control zone, and the mapping relation therebetween will be described later with reference to FIG. 3.

The storage unit 150 can include at least one of memory types such as a flash memory type, a hard disk type, a micro type, and a card type (e.g., a secure digital (SD) card or a extreme digital (XD) card), a dynamic random access memory (DRAM), a static RAM (SRAM), a read-only memory (ROM), a programmable ROM (PROM), an electrically erasable PROM (EEPROM), a magnetic RAM (MRAM), a magnetic disk, and an optical disk type memory. The user device can be operated in related with the web storage which performs the storage function of the storage unit 150 on Internet.

The interface unit 160 can serve as a passage for all external devices which are connected to the user device. The interface unit 160 can receive data transmitted from an external device, receive power to transmit to each internal component of the user device, or transmit internal data of the user device to the external device. For example, the interface unit 160 can include a wired/wireless headset port, an external charger port, a wired/wireless data port, a memory card port, a port for connecting a device equipped with an identification module, an audio input/output port, a video input/output port, and an earphone port.

The controller 170 can control overall operation of the user device. For example, the controller 170 can perform control related with a voice communication, a data communication, and a video communication. The controller 170 can process operations related with the volume control of media content and the control of the play related function (e.g., a pause, a play, and a stop) in response to the volume control, and can include the data processing module 172 for processing the operations. The data processing module 172 can include a content play module 174, a volume control module 176, and a function processing module 178. In various embodiments of the present disclosure, the data processing module 172 can be implemented in the controller 170, and can be implemented separately from the controller 170. Additional information related to the content play module 174, the volume control module 176, and the function processing module 178 will be described later with reference to the attached drawings.

In various embodiments of the present disclosure, the controller 170 (e.g., the content play module 174) can play a corresponding media content in response to the user input of executing media content, and display a screen related with the play of the media content. The controller 170 (e.g., the volume control module 176) can control the sounds to be outputted based on a basic volume value which is previously set in response to the user input of executing the media content, or a volume value which is previously set for the media content.

The controller 170 (e.g., the content play module 174) can resume the play of the media content in response to the user input for increasing the volume in a state in which the media content is paused (or stopped) by the volume down. The controller 170 (e.g., the volume control module 176) can be operated to set the volume value corresponding to the user input for the volume up at the time of resuming the play of the media content. Further, the controller 170 (e.g., the content play module 174) can be operated to maintain the pause (or stop) state of the media content in response to the user input for the volume up in a state in which the media content is paused (or stopped) by the stop button for the play-related function control, and the controller 170 (e.g., the volume control module 170) can be operated to set only the volume value corresponding to the user input for the volume up.

The controller 170 (e.g., the function processing module 178) can control the function related with the play of the media content when the user input of decreasing the volume satisfies the play control zone. When the volume turn-off section and the play control zone are set to be overlapped in the same area, the controller 170 (e.g., the function processing module 178 can set the volume value to zero when the volume value is set to zero according to the volume down, that is, when reaching the volume turn-off section, and, at the same time, can determine the play-related function control by the play control zone and control the set play-related function. According to an embodiment of the present disclosure, the controller 170 (e.g., the function processing module 178) can operate to pause the play of the media content.

Further, when the play control zone is set to be lower than the volume turn-off section, the controller 170 (e.g., the function processing module 178) can control the preset play-related function in response to the user input of proceeding to the play control zone after setting the volume value to zero according to the volume down, i.e., reaching the volume turn-off section. According to an embodiment of the present disclosure, the controller 170 (e.g., the function processing module 178) can operate to pause the play of the media content. At this time, the controller 170 (e.g., the content play module 174) can maintain the play of the media content when the volume value is set to zero in response to the user input, and the controller 170 (e.g., the volume control module 176) can operate to block the sound output.

The detailed control operation of the controller 170 will be described later in the operation example of the user device and the control method thereof with reference to the attached drawings.

Further, the controller 170 according to an embodiment of the present disclosure can control various operations related with the general function of the user device in addition to the above function. For example, when a specific application is executed, the controller 170 can control the operation of the application and the screen display. Further, the controller 170 can receive an input signal corresponding to various touch event inputs which are supported by a touch-based input interface (e.g., a touch screen 130), and control a corresponding function operation. Further, the controller 170 can control transmission and reception of various data based on wired or wireless communication.

The power supply unit 180 can receive external power or internal power under control of the controller 170, and supply power which is needed for operation of each component.

As described above, the user device according to various embodiments of the present disclosure can be implemented by a content play module 174, which is executed by a computer, for playing the media content in response to the execution of the media content and displaying the screen of the media content which are being played, a volume control module 176, which is executed by a computer, for adjusting the volume of the output sound of the media content in response to the user input, and a function processing module 178, which is executed by a computer, for controlling the play-related function (e.g., a pause, a stop, and a play) of the media content in response to the user input of adjusting the volume.

In various embodiments of the present disclosure, the content play module 174 can operate to resume the play of the media content in response to the user input for the volume up in a state in which the media content is paused (or stopped) by the volume down. In various embodiments of the present disclosure, the volume control module 176 can operate to set the volume value corresponding to the user input for the volume up when the play of the media content is resumed.

In various embodiments of the present disclosure, the content play module 174 can operate to maintain the pause (or stop) state of the media content in response to the user input for the volume up in the status in which the media content is paused (or stopped) by the play/stop button allocated for controlling the play-related function of the media content. In various embodiments of the present disclosure, the volume control module 176 can operate to set the volume value corresponding to the user input for the volume up in a state in which the pause (or stop) status of the media content is maintained.

In various embodiments of the present disclosure, the function processing module 178 can operate to pause (or stop) the media content when the user input of down-adjusting the volume can satisfy the play control zone. In various embodiments of the present disclosure, in the case in which the volume value is set to zero according to the volume down, that is, when the user input for the volume down reaches the volume turn-off section, the function processing module 178 can operate to determine the entrance to the play control zone and pause (or stop) the play of the media content. In various embodiments of the present disclosure, when the play control zone is set lower than the volume turn-off section, the function processing module 178 can operate to determine the entrance to the play control zone when the user input for the volume down is further proceeded than the volume turn-off section, and can pause (or stop) the play of the media content.

The above-described user device according to various embodiments of the present disclosure can include all devices which use an application processor (AP), a graphic processing unit (GPU), and a central processing unit (CPU), such as all information and communication devices, multi-media devices, and their application devices which support the function of the present disclosure. For example, the user device can include devices such as a tablet personal computer (PC), a smart phone, a portable multimedia player (PMP), a media player (e.g., an MP3 player), a portable game console, and a personal digital assistant (PDA) as well as mobile communication terminal which operates based on various communication protocols corresponding to various communication systems. Further, the function control method according to various embodiments of the present disclosure can be applied to a laptop computer (e.g., a notebook), a personal computer (PC), or various display devices such as a digital TV, a digital signage (DS), and a large format display (LFD).

Further, various embodiments described in the present disclosure can be implemented in a recording medium which can be read by a computer or a device similar to the computer by using software, hardware, or a combination thereof. According to hardware implementation, the embodiments described in the present disclosure can be implemented by using at least one of application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, or electric units for performing other functions.

Further, in some cases, the embodiments described in the present specification can be implemented with the controller 170 itself. According to software implementation, the embodiments such as the procedure and function described in the present specification can be implemented with separate software modules (e.g., the content play module 174, the volume control module 176, or the function processing module 178). The respective software modules can perform one or more functions and operations described in the present specification.

Here, the recording medium can include a computer-readable recording medium having stored therein a program which performs an operation of playing media content in response to the execution of media content, an operation of displaying the screen of the played media content, an operation of adjusting the volume of output sound of the media content, and an operation of controlling the set play-related function (e.g., a pause, a stop, and a play) of the media content in response to the user input of adjusting the volume.

FIGS. 2A to 2D schematically illustrates a volume control section which is provided by a user device according to an embodiment of the present disclosure.

FIG. 2A shows an example of the volume control section which can be generally set in the user device. FIG. 2A shows a case in which the volume control section is configured of steps "0 to 10". Hence, the user can set a specific volume value by continually adjusting the volume value within the volume control section of 0 to 10 by the volume control key (e.g., a hardware button) of the user device, or a touch-based user gesture (e.g., a drag) input.

FIG. 2B shows a case where the user device provides a play control zone by using a volume control section. FIG. 2B shows a case where the volume control section is configured of 0 to 10 levels, and a play control section for controlling the play-related function is set in the volume turn-off section 210 where the volume value is set to zero in the volume control section. Hence, the user can set the volume value to zero and, at the same time, can pause (or stop) the media content by the user input of decreasing the volume by using the volume control key of the user device or the touch-based user gesture (e.g., a drag). When the user input of decreasing the volume reaches the volume zero section 210, the controller 170 can set the volume value to zero, and pause (or stop) the play of the media content.

FIG. 2C shows a case where a play control zone is provided by adding to the volume control section in the user device. FIG. 2C shows a case where the volume control section is configured of 0 to 10 levels, and a play control zone for continually controlling the play-related function is set in the volume control section. According to an embodiment of the present disclosure, a play control zone 220 capable of pausing the play of the media content can be provided consecutive to the volume turn-off section 210 from the volume control section. Hence, the user can pause (or stop) the media content while setting the volume value to zero by extending the user input of decreasing the volume to the play control zone 220 via the volume turn-off section 210 by using the volume control key of the user device or a touch-based user gesture (e.g., a drag). The controller 170 can set the volume value to zero when the user input of decreasing the volume reaches the volume turn-off section 210, and can pause (or stop) the play of the media content when the user input enters the play control zone 220 via the volume turn-off section 210.

FIG. 2D shows a case where the user device provides a plurality of play control zones by adding to the volume control section. FIG. 2D shows a case where the volume control section is configured of 0 to 10 levels, and a plurality of play control zones for continually controlling the play-related function is set in the volume control section. According to an embodiment of the present disclosure, a first play control zone 220 capable of pausing the play of the media content consecutive to the volume turn-off section 210, and a second play control zone 230 capable of ending the play function of the media content can be provided from the volume control section. Hence, the user can pause (or stop) the media content while setting the volume value to "0" by extending the user input of decreasing the volume to the first play control zone 220 via the volume turn-off section 210 by using the user device's volume control key or a touch-based user gesture (e.g., a drag). Further, the user can end the play function of the media content by extending the user input up to the second play control zone 230 via the first play control zone 220. The controller 170 can set the volume value to zero when the user input of decreasing the volume reaches the volume turn-off section 210, can pause the play of the media content when the user input enters the first play control zone 220 via the volume zero section 210, and can end the play function of the media content when the user input enters the second play control zone 230 via the first play controls zone 220.

Further, FIGS. 2A to 2D illustrate cases where the volume turn-off section 210 or the first play control zone 220 is set to pause the play of the media content, and the second play control zone 230 is set to end the play function of the media content. However, it is noted that the function of the play control zone according to the present disclosure can be variously implemented according to the user's setting. According to another embodiment of the present disclosure, the first play control zone 220 can be set to stop the play of the media content. Further, the first play control zone 220 can be set to pause the play of media content, and the second play control zone 230 can be set to stop the play of the media content. Further, as shown in FIG. 2D, by extending the play control zone, the first play control section 220 can be set to pause the media content, the second play control section 230 can be set to stop the play of the media content, and a third play control section (not shown) can be set to end the play function of the media content.

Figure 3:
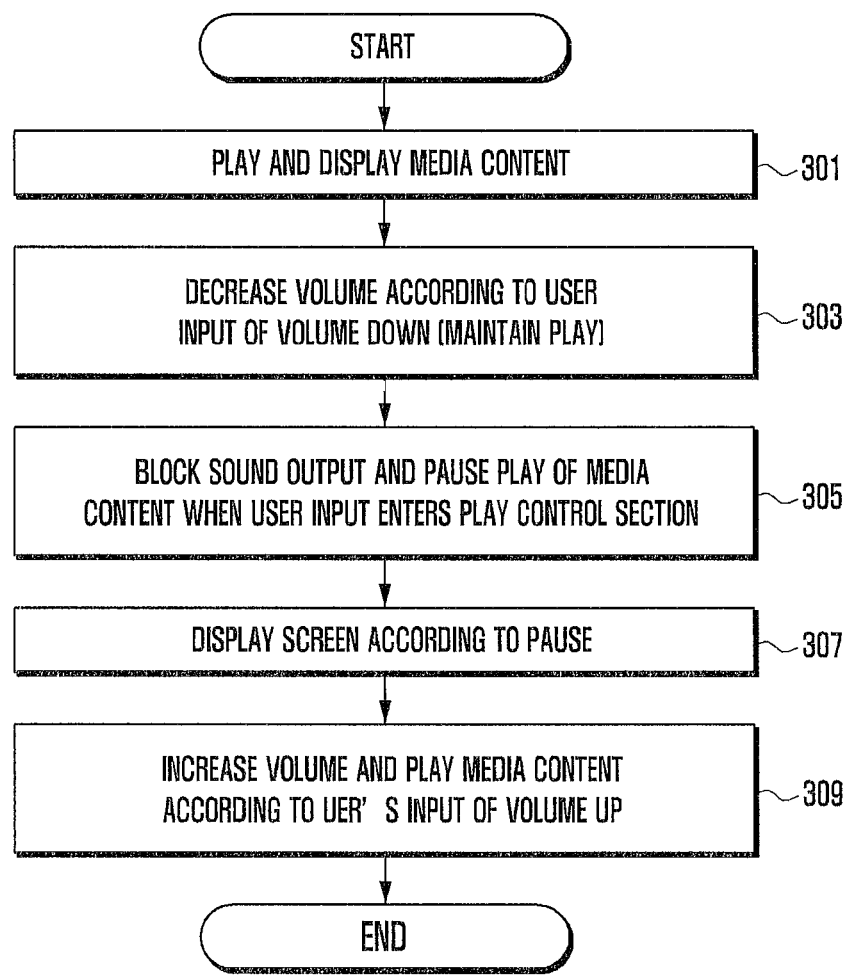
FIG. 3 is a flowchart illustrating a method of processing a function in a user device according to an embodiment of the present disclosure.

FIG. 3 is a flowchart illustrating processing a function in a user device according to an embodiment of the present disclosure. Referring to FIG. 3, the controller 170 can play and display the media content at operation 301. For example, the controller 170 can play a pertinent media content in response to the execution request of the user's specific media content, and can control the screen display corresponding to the play of the media content. The controller 170 can control the output of sound according to the play of the media content by referring to the basic volume value or the previously-set volume value when playing the media content.

The controller 170 can decrease the volume of the media content in response to the user's instruction in the status in which the media content is played at operation 303. The controller 170 can gradually decrease the volume value in response to the user input, and thereby control a corresponding output of sound.

The controller 170 can pause the play of the media content and block the output of sound when sensing the entrance to the play control zone in a status in which the user input is maintained at operation 305. For example, when the play control zone is set by the volume turn-off section, the controller 170 can pause the play of the media content while setting the output of sound to volume "0" when the user input enters the volume turn-off section. Further, if the play control zone is set to be lower than the volume turn-off section, when the user input enters the volume turn-off section, the controller 170 sets the sound output to volume "0" and maintains the play of the media content, and if the user input proceeds to the play control zone via the volume turn-off section, the controller 170 can pause the play of the media content.

When the media content is paused according to the user input by the volume down, the controller 170 can display the corresponding screen at operation 307. For example, the controller 170 can display the screen where the media content is stopped, and can display a state item which guides that the media content is paused by the volume down through the state bar or the stopped screen. The state item will be described later.

The controller 170 can resume the play of the media content in response to the user input of increasing the volume in the status of volume "0" for the media content and pause at operation 309. For example, when the play control zone is set by the volume turn-off section, the play of the media content can be resumed while increasing the volume of the sound output in response to the user input of increasing the volume. Further, when the play control zone is set to be lower than the volume turn-off section, only the play of the media content can be resumed while maintaining the volume "0" of the sound output when the user input enters the volume turn-off section, and the volume of the sound output can be increased when the user input passes the volume turn-off section. At this time, the controller 170 can omit the display of the state item which is displayed in association with the pause of the media content.

Figure 4A:
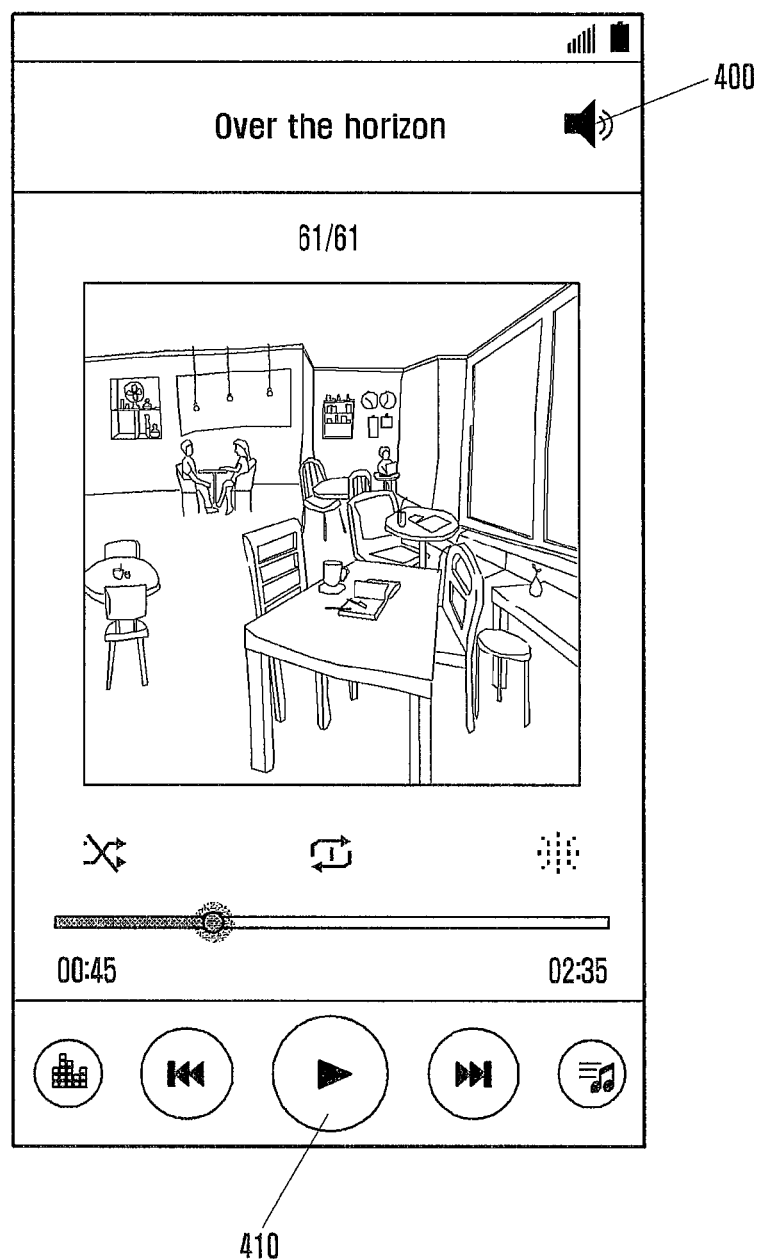
FIGS. 4A and 4B illustrate an example of a stop screen of media content in a user device according to embodiments of the present disclosure.
Figure 4B:
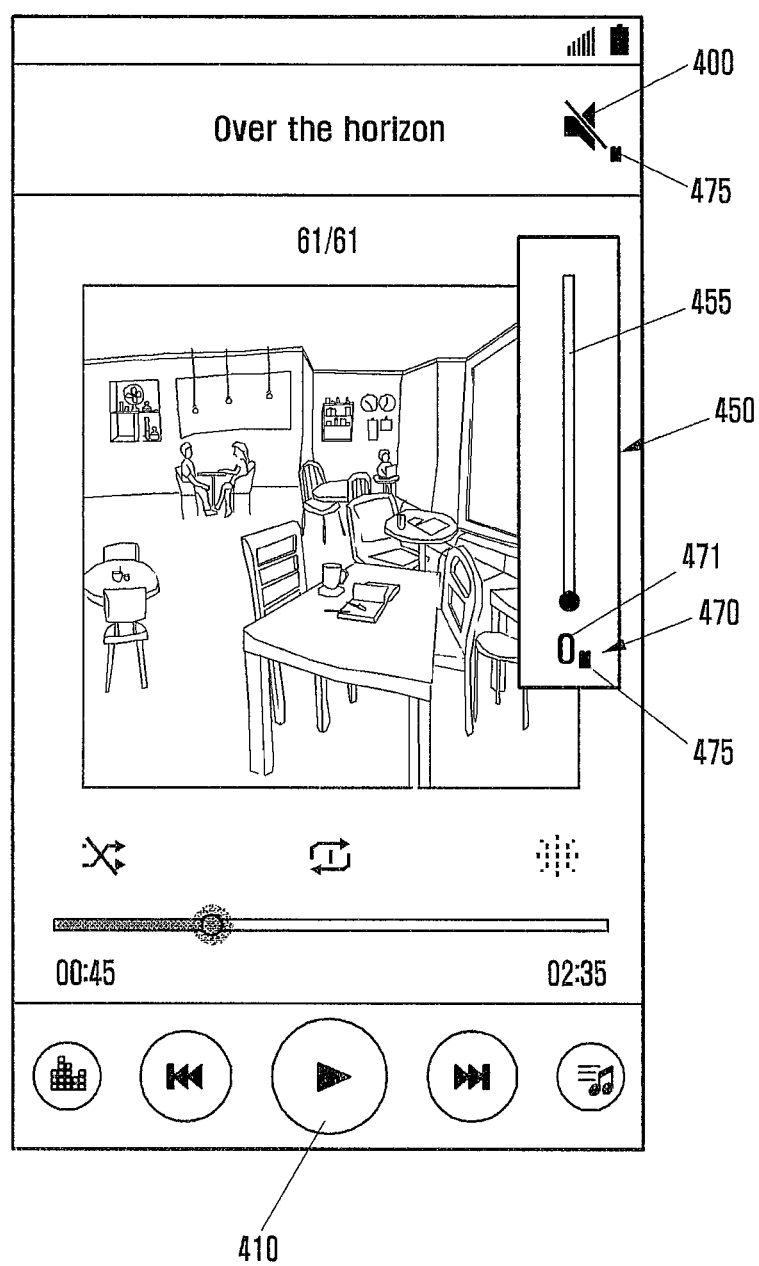

FIGS. 4A and 4B illustrate examples of a paused screen of media content in a user device according to embodiments of the present disclosure. FIG. 4A and FIG. 4B show a screen example of the user device when media content is music content, and the user of the user device stops the media content (music content) which is being played.

FIG. 4A shows a screen example of the user device when the user stops media content by using the play/stop button 410 among buttons for controlling the play-related function (e.g., a pause, a stop, a play, etc.) which is provided for the media content. FIG. 4A show that the play/stop button 410, among buttons for controlling the play-related function of media content, is in a pause state. According to an embodiment of the present disclosure, generally, when the media content is in a pause state or stop state, the play/stop button 410 can display an icon such as "▶" or "||", and when the media content is in a play state, the play/stop button 410 can display an icon such as "▶" or "||". Hence, the user can recognize whether the media content is in a play state or a pause (stop) state, depending on the type of the icon display of the play/stop button 410.

FIG. 4B shows a screen example of the user device when the user stops the media content by using the volume down. FIG. 4B can show that the play/stop button 410, among buttons for controlling the play-related function of media content, is in a pause state. Further, various state items can be provided when the media content is paused by the volume down. According to an embodiment of the present disclosure, the state item can be divided into a volume state item 400 for providing the sound output state and the stop state of the media content, and a volume control item 450 for adjusting the volume value of the sound output in response to the user input.

The volume control item 450 can be displayed in response to the user input (e.g., a tab, a touch, and a double tab) selecting the volume state item 400, and the volume control can be performed in response to the user input (e.g., a drag) for the volume control on the volume state item 400. The volume control item 450 can include a scroll area 455 which is scrolled in response to the user input and the volume area 470 where the volume information 471 (e.g., the set volume value) is displayed in response to the user input. According to an embodiment of the present disclosure, the volume value, which is changed according to the user input within the scroll area 455, can be displayed in the volume area 470. In various embodiments of the present disclosure, the volume control item 450 can be displayed in response to the hardware button input which is prepared for the volume control in one side of the user device.

In various embodiments of the present disclosure, the volume information 471 which is set according to the user input can be displayed in the volume area 470, and when the user input enters the play control zone, the stop state item 475 can be displayed along with the volume information 471 in the volume area 470. In the embodiment of the present disclosure, the stop state item 475 enables a general stop by the play/stop button 410 to be easily distinguished from the stop by the volume down, and can be displayed by generation of an event which stops the play of the media content as the user input of decreasing the volume enters the play control zone.

Further, as illustrated in FIGS. 4A and 4B, the volume state item 400 of providing the sound output state related with the play of the media content can be displayed in a certain area of the play screen. In various embodiments of the present disclosure, the volume state item 400 can receive the user input and can provide relevant information at the time of a pause by the volume down. In the embodiment of the present disclosure, the volume state item 400 enables a general stop by the play/stop button 410 to be easily distinguished from the stop by the volume down, and can be converted from the state shown in FIG. 4A into the state shown in FIG. 4B when an event of pausing the play of the media content occurs as the user input of decreasing the volume enters the play control zone. According to an embodiment of the present disclosure, the volume value can be set to be "1" or more so that the volume state item 400 is displayed as an icon of a state in which the sound output is possible (e.g., an icon of a speaker type of displaying the sound output state), and the volume state item 400 can be displayed during the play of the media content or the general stop operation.

When the user sets the volume value to "0" in a state shown in FIG. 4A, the volume state item 400 can be converted into an icon (e.g., an icon having a shape where an oblique line is drawn in the speaker which displays the silent output state of the sound) in the status in which sound output does not exist as in FIG. 4B, and can be displayed when the volume of the media content is set to "0". Further, as illustrated in FIG. 4B, when the user input enters the play control zone, the volume state item 400 can be displayed as the silent stop icon which further includes the stop state item 475. According to an embodiment of the present disclosure, the stop state item 475 can be displayed along with the icon having a shape where oblique line is drawn in the speaker.

Figure 5A:
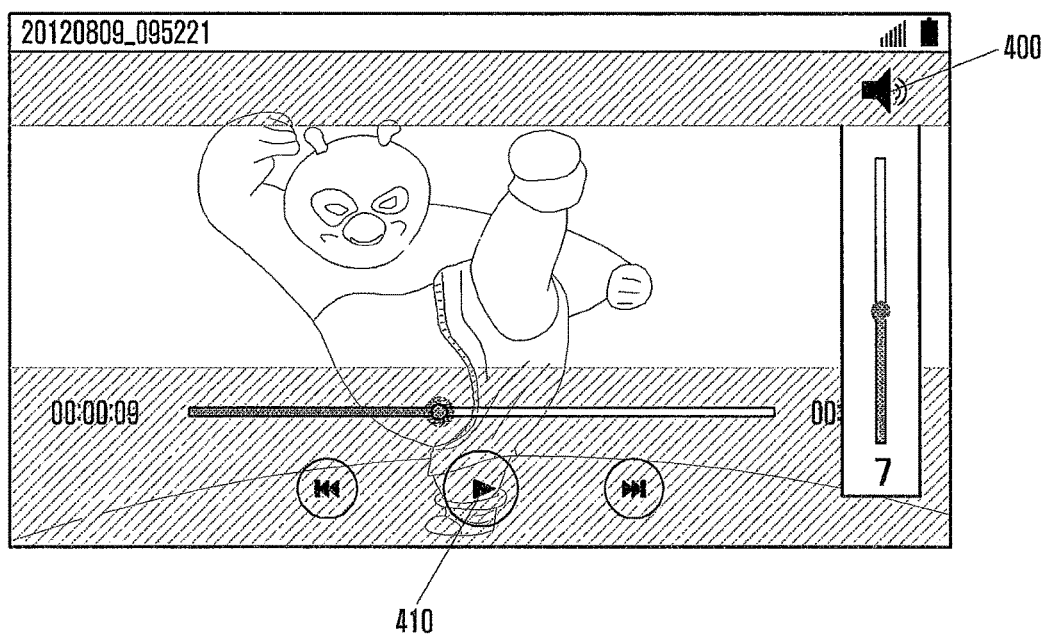
FIGS. 5A and 5B illustrate an example of a stop screen of media content in a user device according to embodiments of the present disclosure.
Figure 5B:
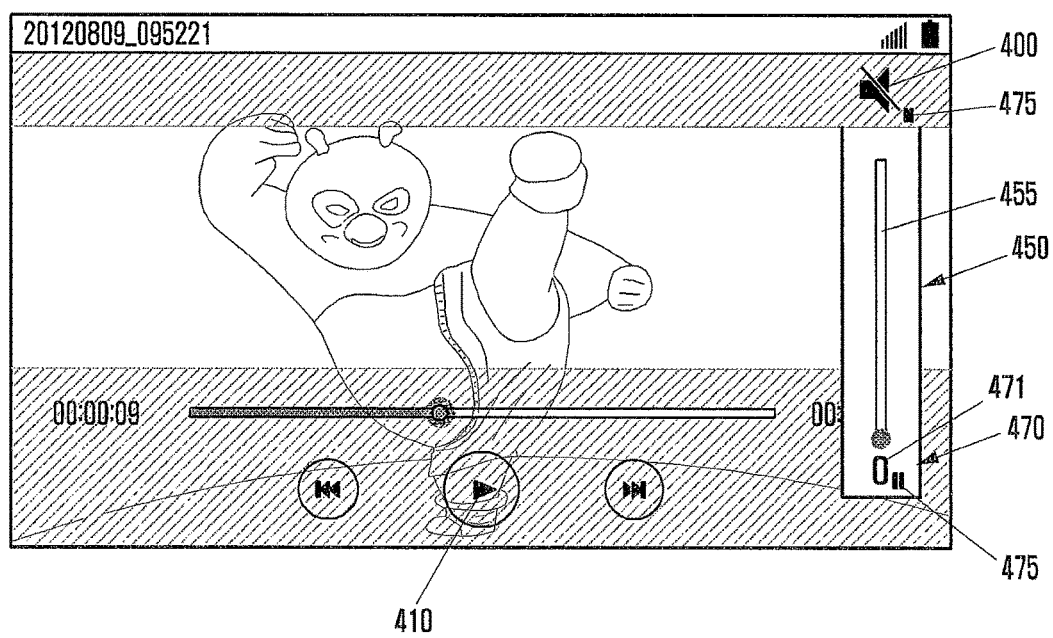

FIGS. 5A and 5B illustrate an example of a stop screen of media content in a user device according to an embodiment of the present disclosure.

FIGS. 5A and 5B illustrate a screen example of the user device when the media content is video content, and the user of the user device stopped the media content (video) which is being played.

FIG. 5A illustrates a case where the volume is adjusted in response to the user input of adjusting the volume (e.g., a volume up or a volume down) by using the volume state item 400 and the volume control item 450 (or a hardware-type volume control key) in a state in which the media content is paused, and the adjusted volume value is set to "7". According to an embodiment of the present disclosure, the volume information 471, such as the volume value "0", which is set in the volume area 400 according to the user input, can be displayed.

FIG. 5B illustrates a case where the volume is set to "0" and the play of the media content is paused in response to the user input of volume down and entrance to the volume turn-off section (e.g., the volume value "0") by using the volume state item 400 and the volume control item 450 (or a hardware-type volume control key). According to an embodiment of the present disclosure, the stop state item 475 can be displayed along with the volume information 471 such as the volume value "0" in the volume area 470 at the time of a pause by the volume down. Further, the stop state item 475 can be displayed even in the volume state item 400.

FIGS. 5A and 5B can correspond to FIGS. 4A and 4B as described above, and only the type of the media content is different. The corresponding description is omitted here.

As shown in FIGS. 4A to 5B, according to various embodiments of the present disclosure, the user's intuitiveness can be enhanced by enabling the stop by the play/stop button 410 to be distinguished from the stop by the volume down by adding a new icon (e.g., a stop state item 475) in association with the media content play. Thus, the user can easily determine whether the play of the media content can be resumed through the user input of increasing the volume (e.g., the play control zone→volume="0"). According to an embodiment of the present disclosure, as illustrated in FIGS. 4A to 5B, when the music or video is stopped by the volume down, it is possible to determine whether the media content is stopped by the volume down by adding an item (e.g., a stop state item 475) which can be distinguished from a general stop. Hence, the user can recognize whether the currently stopped media content is stopped by the volume down through the stop state item 475, and thus, the media content can be simultaneously played while adjusting the volume up.

FIGS. 6A to 6D illustrate an operation example of notifying the play state of media content in a user device according to an embodiment of the present disclosure.

FIGS. 6A to 6D illustrate a case where the play state of media content (e.g., a play, a pause, silence (volume="0"), or a volume down stop) is provided through the state bar in a standby state of the user device.

As shown in FIGS. 6A to 6D, FIG. 6A shows a screen example of the user device at the time of playing the media content, and can indicate that the media content is being played by displaying the play icon 610 in a certain side (e.g., most left side) of the state bar 600.

Figure 6A:
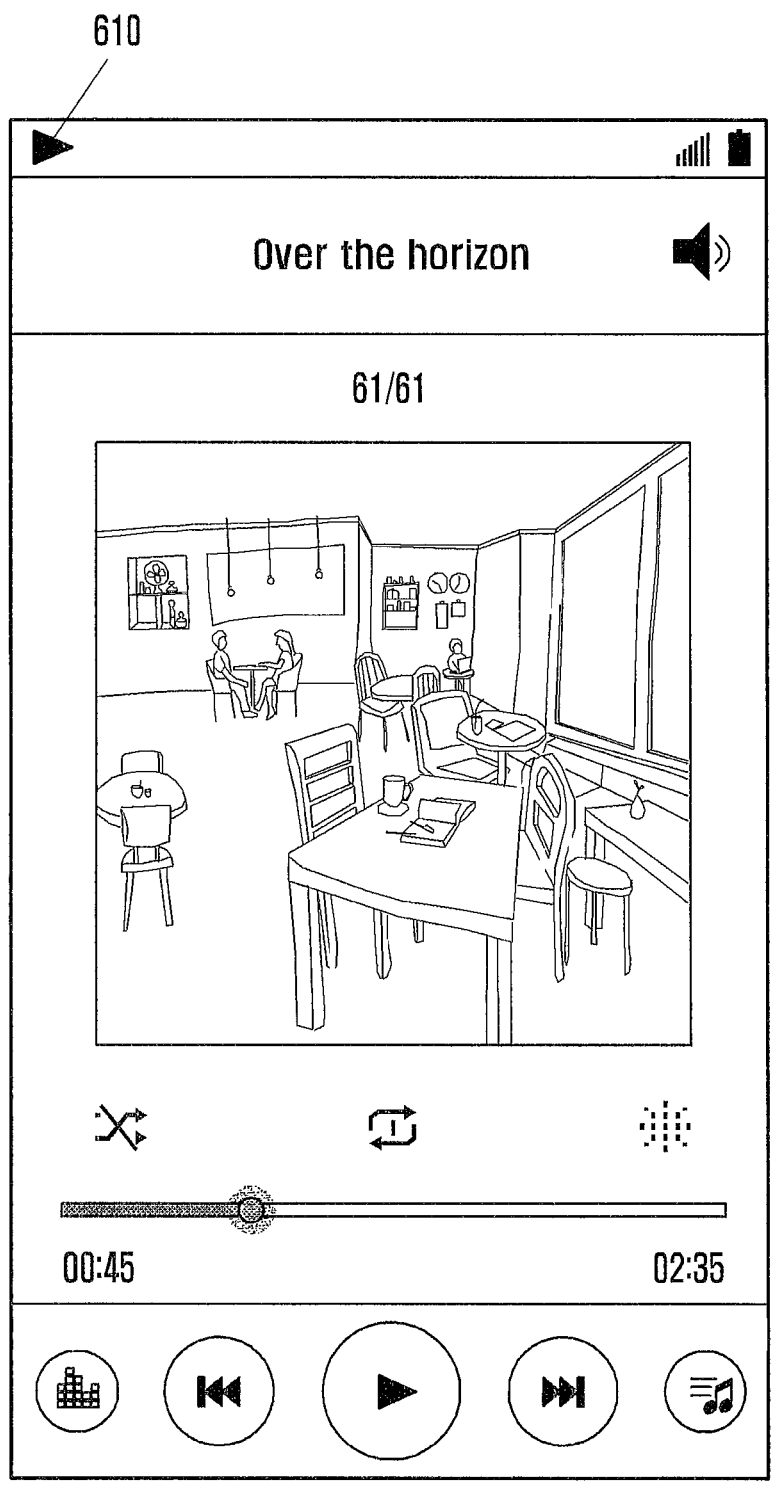
FIGS. 6A to 6D illustrate operation examples of notifying the play state of media content in a user device according to embodiments of the present disclosure.
Figure 6B:
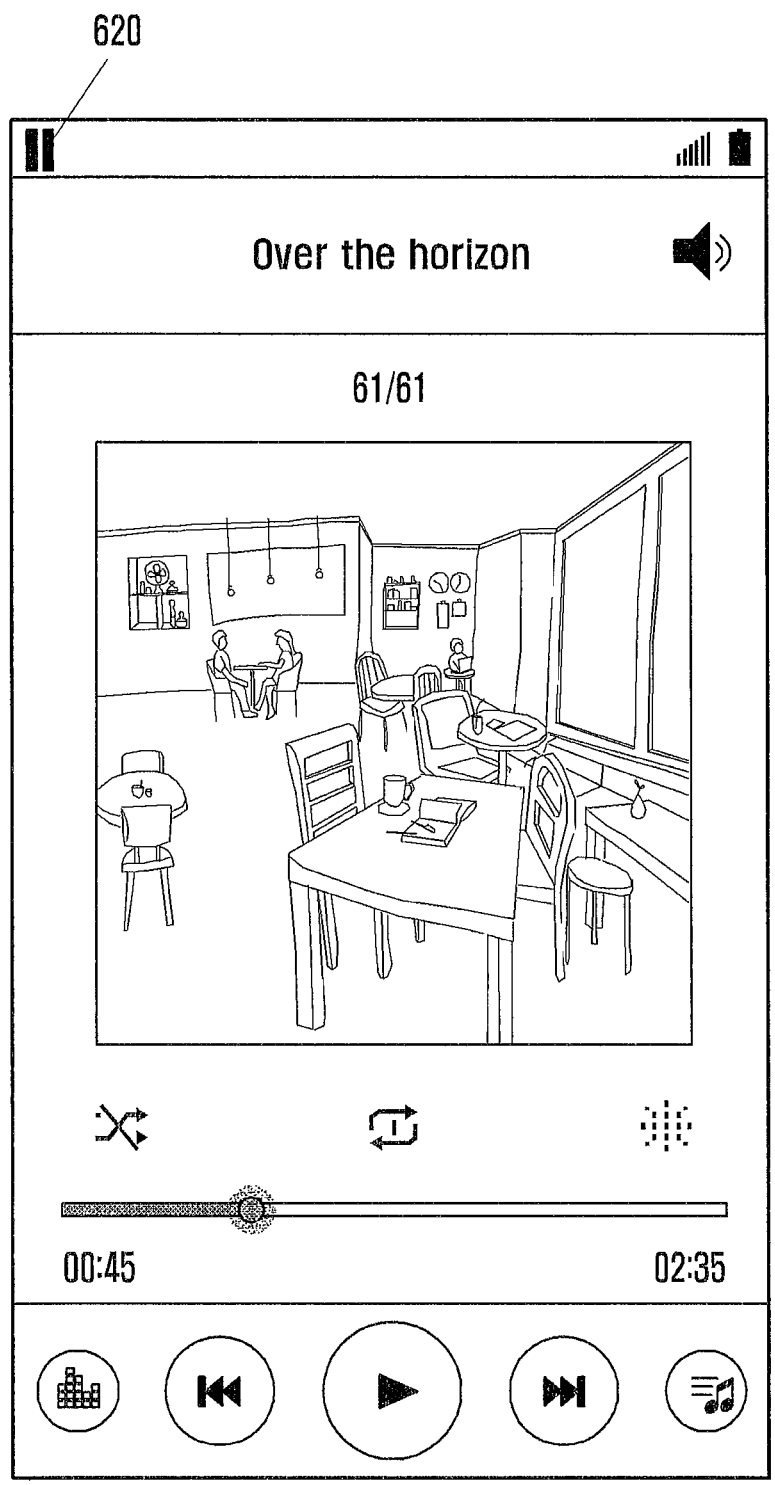

FIG. 6B shows the screen example of the user device in a status in which the media content is paused by a general stop function, and can indicate that the media content is in a pause state through the pause icon 620 in a certain side (e.g., most left side) of the state bar 600.

Figure 6C:
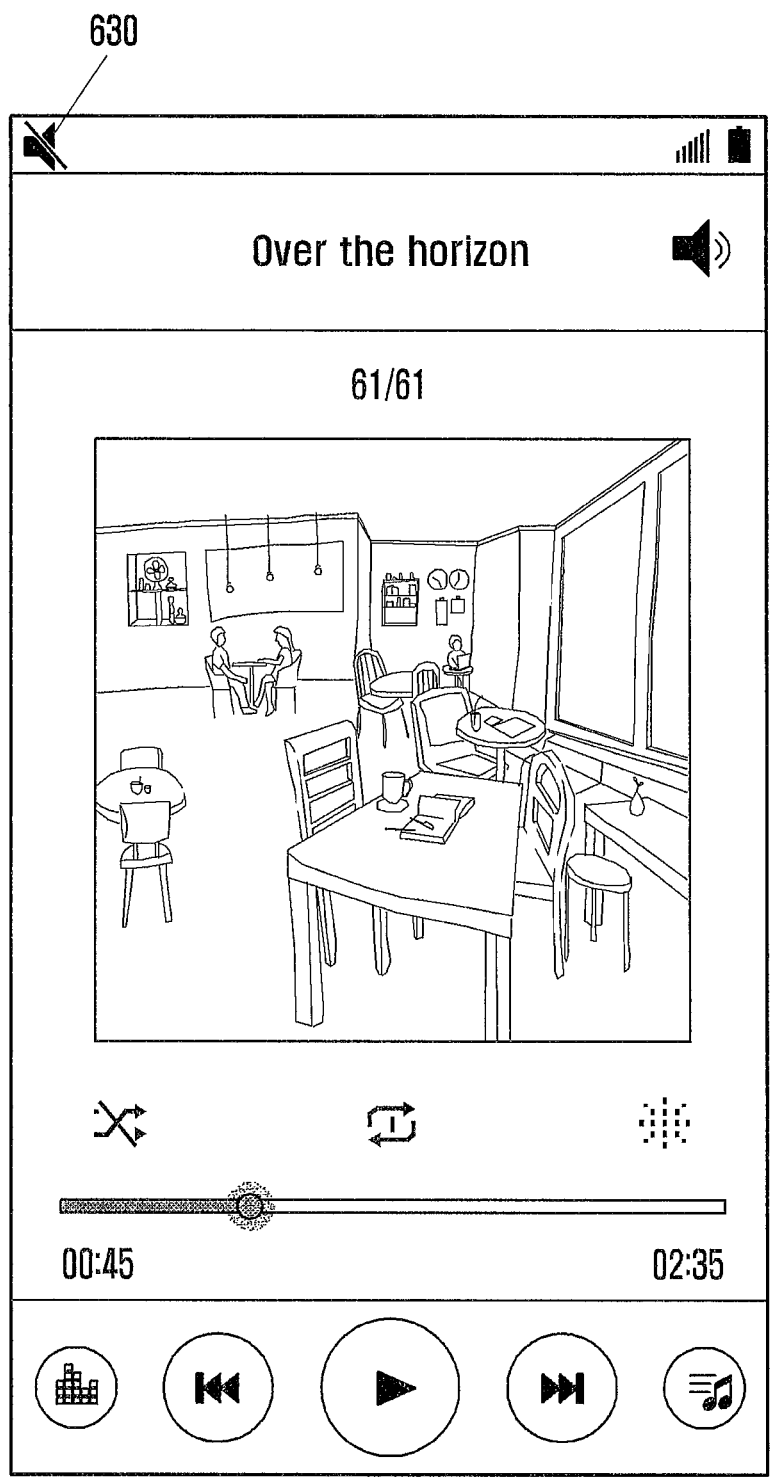

FIG. 6C shows the screen example of the user device when the media content is played silently with the setting of the volume value zero, and can indicate that the media content is being played with no sound through the silence icon 630 in a certain side (e.g., most left side) of the state bar 600.

Figure 6D:
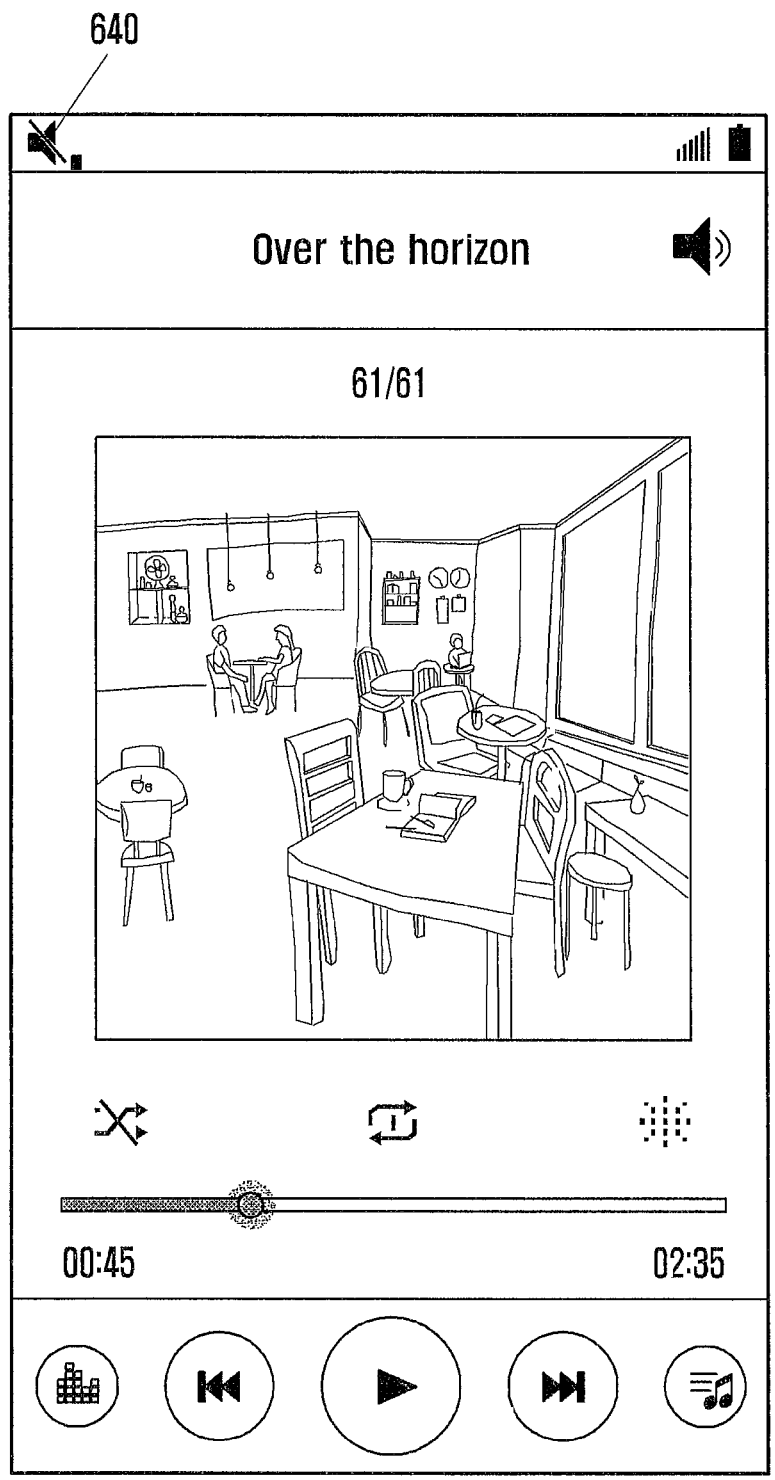

FIG. 6D illustrates a screen example of the user device in a state in which the media content is paused by the volume down, and can indicate that the media content is in a pause state by the volume down through the silent stop icon 640 in a certain side (e.g., most left side) of the state bar 600. The silent stop icon 640 can correspond to the volume state item 400 which is the combination of the silence icon 630 indicating that the sound output is operating silently (e.g., the volume value "0") by the volume down, and the pause icon 620 indicating that the media content is in a pause state.

Referring to FIGS. 6A to 6D, according to an embodiment of the present disclosure, even in the standby screen state of the user device, a corresponding item related with the "play" or "pause" can be displayed when pausing or playing the media content. Further, according to an embodiment of the present disclosure, when the media content is paused by the hardware-type volume key in the standby state of the user device, the silent stop icon 640 can be displayed to make the user to recognize the stop state by the volume down. Hence, the user can play the media content through the volume up operation in the standby screen through the silent stop icon 640.

Figure 7A:
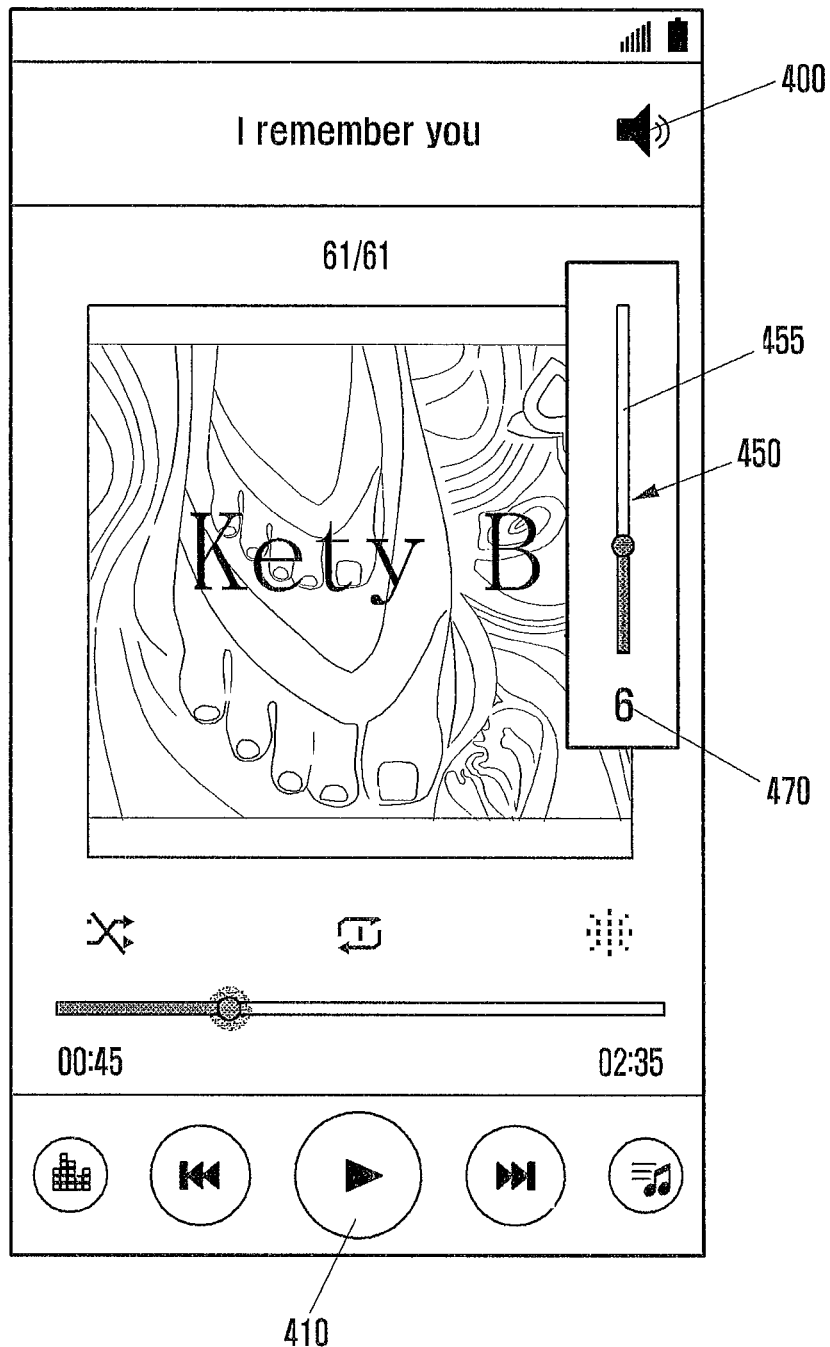
FIGS. 7A to 7C illustrate pausing media content in a user device according to embodiments of the present disclosure.
Figure 7B:
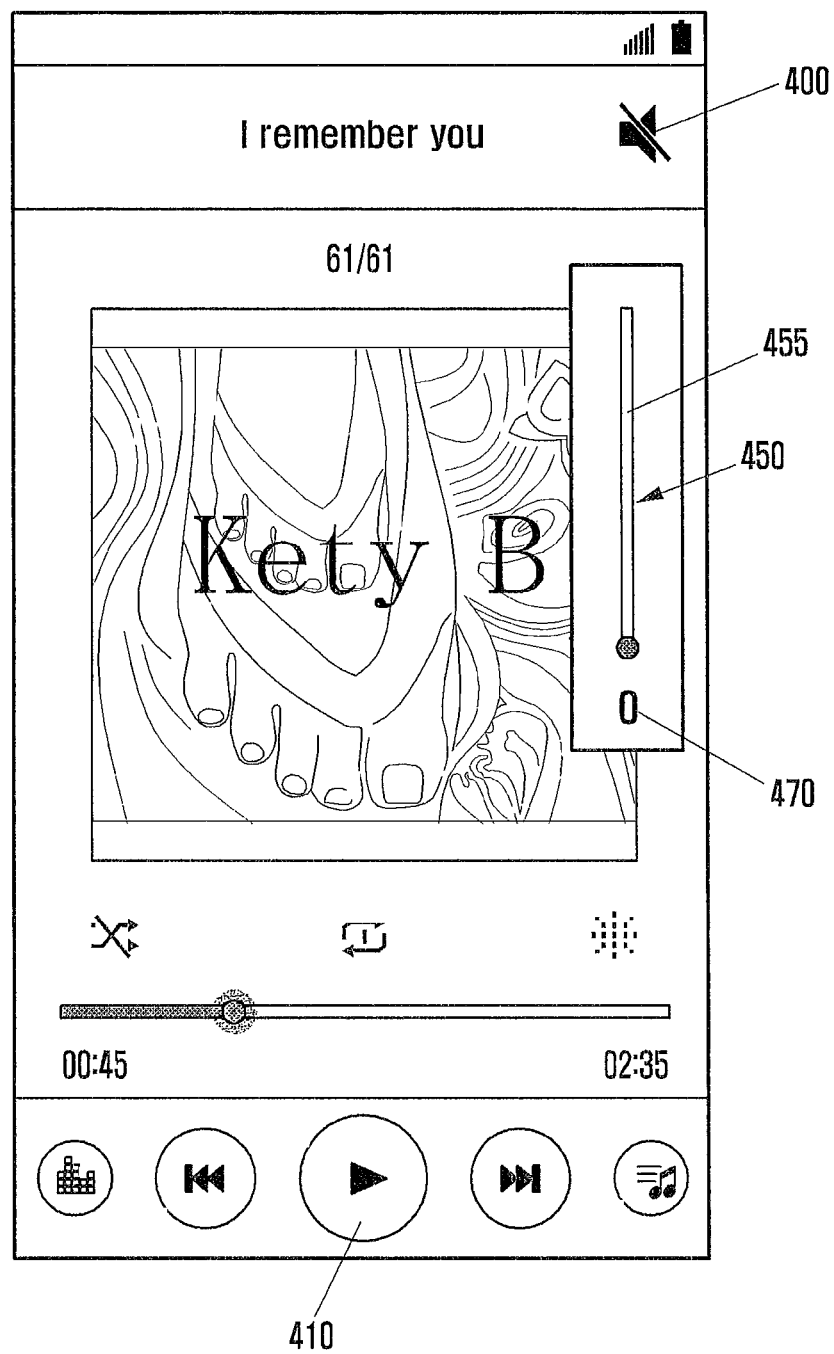
Figure 7C:
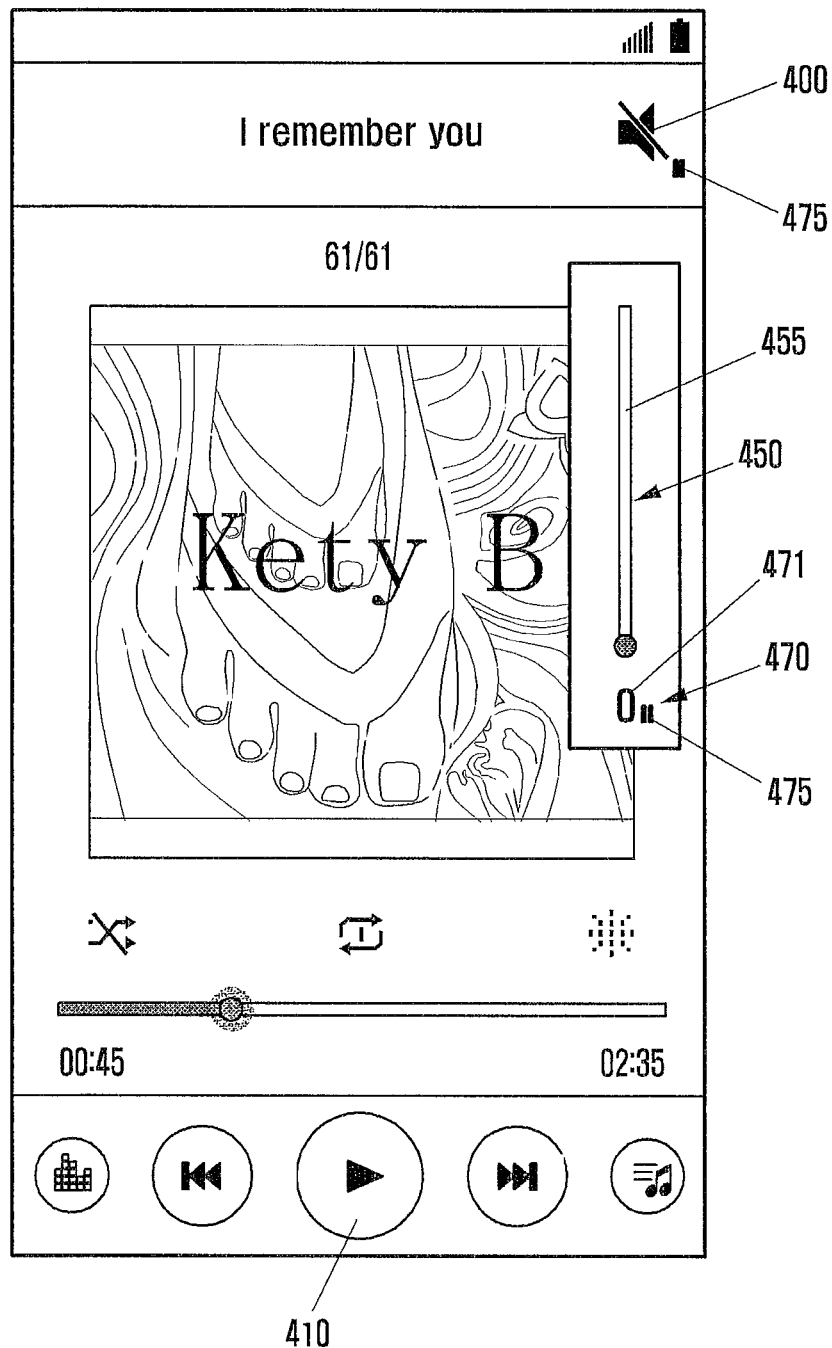

FIGS. 7A to 7C illustrate operations of pausing media content in a user device according to an embodiment of the present disclosure.

FIG. 7A shows the screen example of the user device when the volume for the sound output is adjusted while the user of the user device plays the media content. FIG. 7A shows an example when the user sets the volume value to "6" by the hardware button or the touch-based user gesture (e.g., a drag) in a state in which the media content is being played. As illustrated in FIG. 7A, the volume control item 450 can be displayed on the play screen of the media content in response to the user input, and the user can check the volume change which is currently adjusted through the scroll area 455 and the volume area 470 of the volume control item 450.

In FIG. 7A, the user can set the volume value to "0", and the user device can perform a corresponding operation in response to the user input of setting the volume value to "0". In the volume turn-off section where the volume value is set to "0", the operation can be divided into a case where the volume turn-off section and the play control zone are set to be the same section and a case where a separate play control zone is set to be lower than the volume turn-off section.

The case where the play control zone is set separately from the volume turn-off section can be operated as follows. For example, in FIG. 7A, when the user input enters the volume turn-off section, as shown in FIG. 7B, the volume value can be set to "0" in response to the user input, and thus, the volume information of the volume area 470 can be displayed as "0", and the volume state item 500 can be changed to the silence icon and displayed. Further, in FIG. 7B, if the user input enters the play control zone via the volume turn-off section as shown in FIG. 7C, the stop state item 475 can be displayed along with the volume information 471 "0" in the volume area 470 in response to the user input, and the volume state item 400 can be changed to the silent stop icon and displayed.

The case where the volume turn-off section and the play control zone are set to be the same section can be operated as follows. For example, in FIG. 7A, when the user input enters the volume turn-off section, as shown in FIG. 7C, the stop state item 475 along with the volume information 471 "0" can be simultaneously displayed in the volume area 470 in response to the user input, and the volume state item 400 can be changed to the silent stop icon and displayed. That is, when the volume turn-off section and the play control zone are set to be the same section, the operation of FIG. 7B can be omitted.

As described above, according to an embodiment of the present disclosure, the play-related function can be simultaneously controlled with the volume control of the media content. According to an embodiment of the present disclosure, the user can easily and conveniently stop the media content by just only an input of adjusting one more level after setting the volume to "0". Further, when the user attempts to stop the media content, which is being played, in the standby screen, the user can stop the media content just only by the operation of decreasing the volume value by the maximum amount by the volume down without inconvenience of entering the media content player and inputting the stop button, and if necessary, the media content can be quickly played through the volume up. Further, the user can easily stop the media content while listening to/viewing the media content by streaming through a network, and thus the power consumption and the amount of data used for streaming can be decreased. Further, the user can easily and quickly stop the media content through the volume down operation by using a hardware-type button (volume control key), which is easily accessible, in order to stop the media content, if necessary, even when a touch lock is executed while viewing a video.

Figure 8:
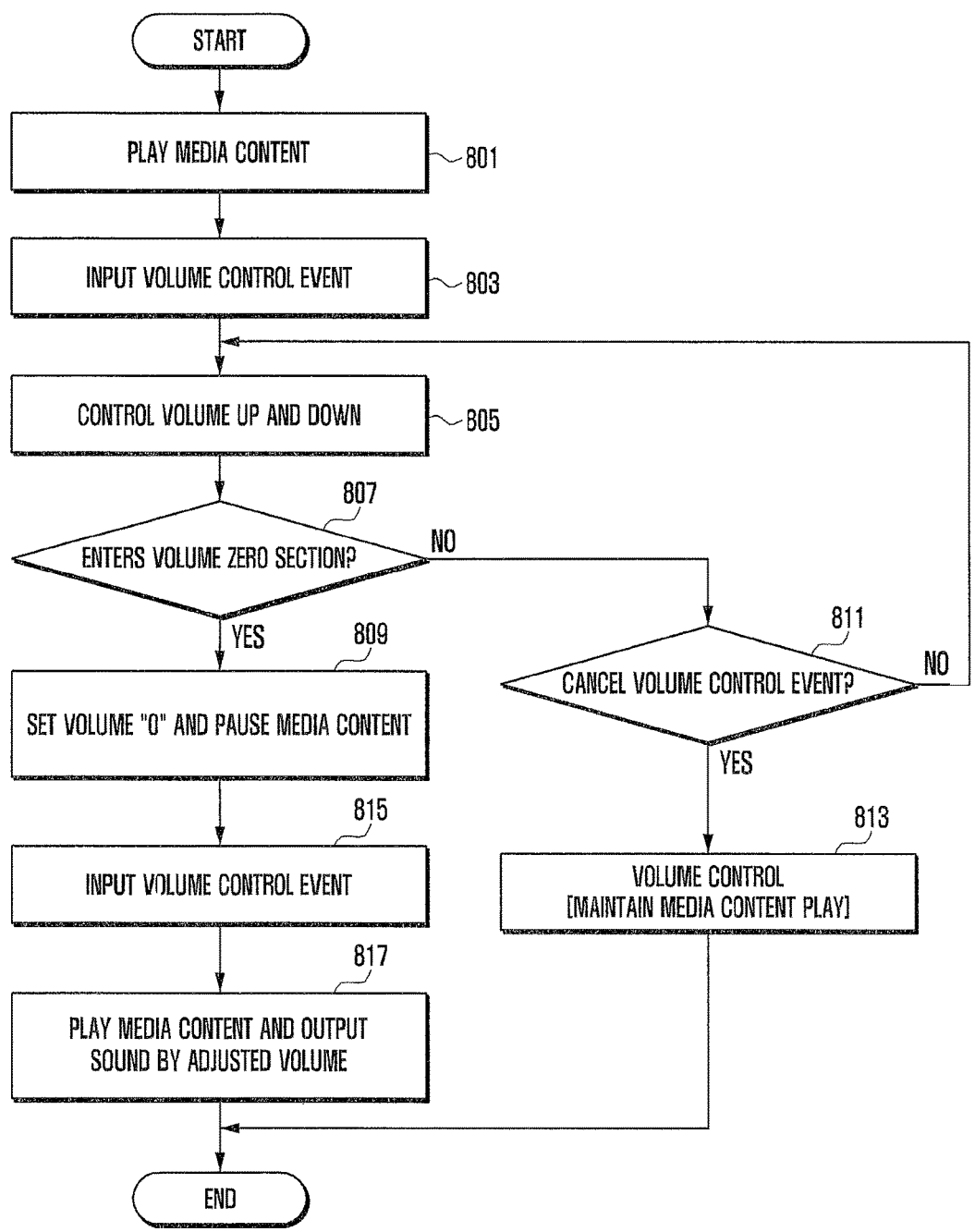
FIG. 8 is a flowchart of controlling a play function based on volume control in a user device according to an embodiment of the present disclosure.

FIG. 8 is a flowchart illustrating a method of controlling a play function in a user device according to an embodiment of the present disclosure. In particular, FIG. 8 shows an example of an operation of processing the play function based on the volume control in a case where the volume turn-off section and the play control zone are operated simultaneously.

Referring to FIG. 8, the controller 170 can play media content at operation 801. For example, the controller 170 can play the media content in response to the execution request of the user's specific media content. When playing the media content, the controller 170 can control to output the sound according to the play of the media content by referring to the basic volume value or the previously-set volume value.

If an input of the volume control event is sensed while the media content is being played at operation 803, the controller 170 can control the increase or decrease of the volume in response to the volume control event at operation 805. For example, the controller 170 can increase the volume of the media content in response to the user input of the volume up, and can decrease the volume of the media content in response to the user input of the volume down.

The controller 170 can determine whether the volume control event enters the volume turn-off section at operation 807. For example, the controller 170 can determine whether the user input enters the volume turn-off section while decreasing the volume according to the user input of the volume down.

If the volume control event does not enter the volume turn-off section (No of operation 807), the controller 170 can determine whether the volume control event has been cancelled at operation 811. If the volume control event is not cancelled, the controller 170 can perform the next operations by returning to operation 805. If the cancellation of the volume control event is sensed, the controller 170 can control to output the sound by the volume value which is adjusted by the volume control event while maintaining the play state of the media content at operation 813.

When the volume control event enters the volume turn-off section (Yes of operation 807), the controller 170 can set the volume to "0" and can pause the media content which is being played at operation 809. That is, when the user input of the volume down enters the volume turn-off section, the controller 170 can simultaneously control the play-related function (e.g., a pause) of the media content while setting the volume value of the media content to "0" in response to the user input.

In a state in which the media content is paused according to the volume control event of decreasing the volume, if an input of the volume control event of the volume up is sensed at operation 815, the controller 170 can control to output the sound by the volume value which is adjusted according to the volume control event while playing the media content which is paused in response to the volume control event of volume up at operation 817.

Figure 9:
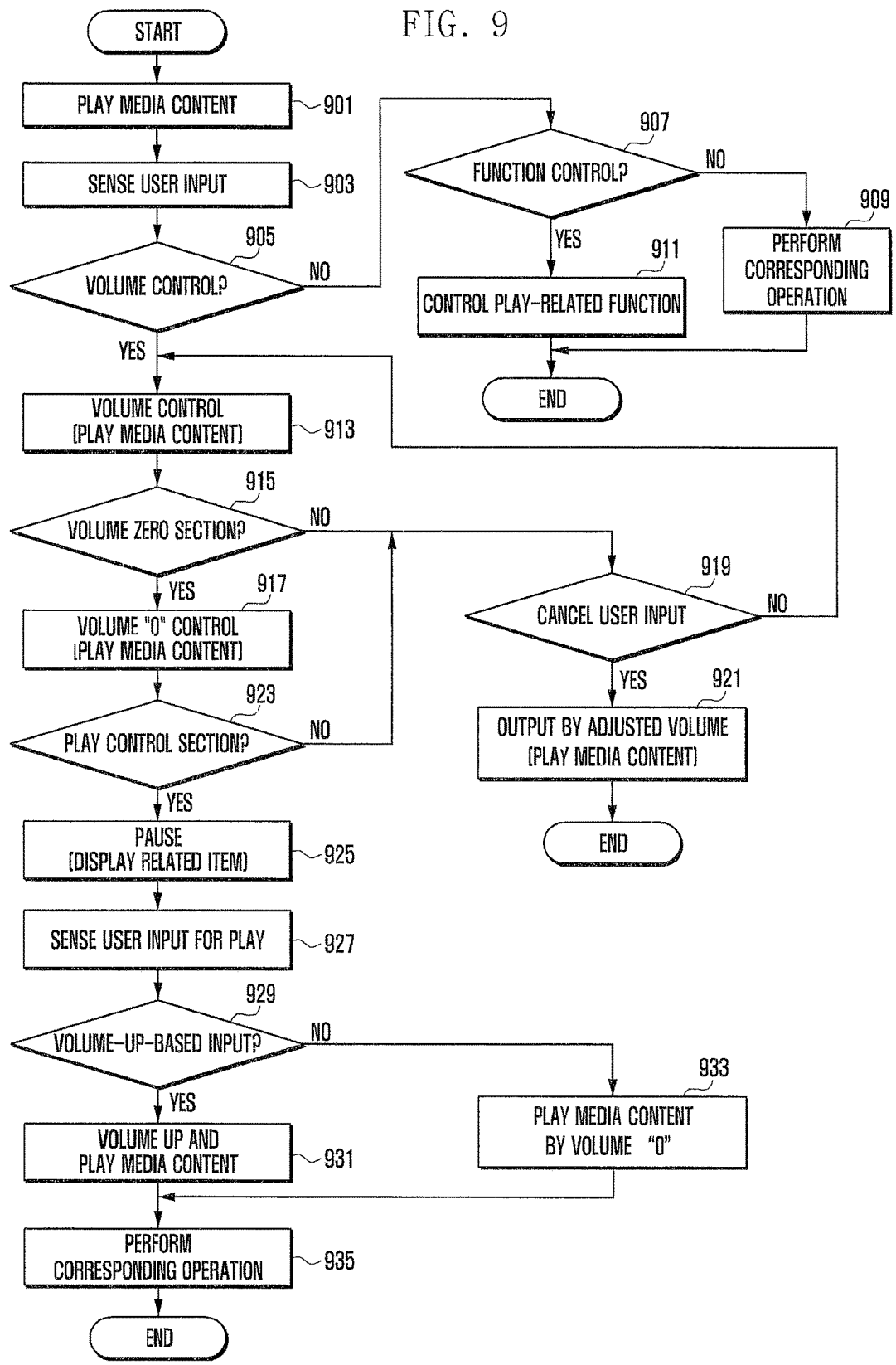
FIG. 9 is a flowchart of controlling a play function based on volume control in a user device according to an embodiment of the present disclosure.

FIG. 9 is a flowchart illustrating a method of processing a function in a user device according to an embodiment of the present disclosure. In particular, FIG. 9 illustrates a method of controlling a play function based on volume control in a user device when the volume turn-off section and the play control zone are separately operated.

Referring to FIG. 9, the controller 170 can play media content at operation 901. For example, the controller 170 can play a corresponding media content in response to the user's execution request of the specific media content. When playing the media content, the controller 170 can control to output the sound according to the play of the media content by referring to the basic volume value or the previously-set volume value.

If the user input is sensed during the play of the media content at operation 903, the controller 170 can determine whether the user input is an input for the volume control at operation 905. For example, the controller 170 can determine whether the user input is an input for the volume control by the volume control key or the touch based user gesture.

If the user input is not an input for volume control (No of operation 905), the controller 170 can determine whether the user input is an input for control of the play-related function at operation 907.

If the user input is not an input for function control (No of operation 907), the controller 170 can control the performance of a corresponding operation in response to the user input at operation 909. According to an embodiment of the present disclosure, the controller 170 can execute another application while maintaining the play of the media content in response to the user input, and can perform a multitasking operation so that the related screen can be displayed.

If the user' input is an input for function control (Yes of operation 907), the controller 170 can control the play-related function in response to the user input at operation 911. According to an embodiment of the present disclosure, the controller 170 can control the function corresponding to the button for the control of the play-related function (e.g., a fast forward button, a rewind button, a play/stop button, a stop button, etc.). For example, the controller 170 can pause the media content in response to the user input for the play/stop button, and control the display of the relevant item.

If the user input is an input for volume control (Yes of operation 905), the controller 170 can adjust the volume of the media content in response to the user input at operation 913. The controller 170 can maintain the play state of the media content when adjusting the volume of the media content.

The controller 170 can determine whether the adjusted volume value reaches "0" while adjusting the volume in response to the user input at operation 915. That is, the controller 170 can determine whether the user input enters the volume turn-off section.

If the user input does not enter the volume turn-off section (No of operation 915), the controller 170 can determine whether the user input for volume control is cancelled at operation 919. The controller 170 can process the next operations by returning to operation 913 if the volume control is not cancelled. If the cancellation of the volume control is sensed, the controller 170 can control to output sound by the volume value which is adjusted by the user input while maintaining the play state of the media content if the cancellation of the volume control is sensed at operation 921.

If the user input enters the volume turn-off section (Yes of operation 915), the controller 170 can set the volume to "0" at operation 917. At this time, the controller 170 can control the silent output while maintaining the play state of the media content.

The controller 170 can determine whether the user input enters the play control zone after setting the volume value according to the user input's entrance to the volume turn-off section at operation 923. For example, the controller 170 can determine whether the user input enters the play control zone which is additionally defined as a level lower than the volume turn-off section in a state in which the user input is maintained.

If the user input does not enter the play control zone (No of operation 923), the controller 170 can process the performance of operation by proceeding to operation 919.

If the user input enters the play control zone (Yes of operation 923), the controller 170 can pause the media content, which is being played, in response to the user input at operation 925. For example, if the user input according to the volume down operation enters the play control zone via the volume turn-off section, the controller 170 can pause the media content while maintaining the volume value "0" setting state. At this time, the controller 170 can display a related item (e.g., the silent stop icon, etc.) according to the pause of the media content by the volume down.

If the user input for the play of the media content is sensed in a state in which the media content is paused by the volume down operation at operation 927, the controller 170 can determine whether the user input is an input for volume control by the volume up at operation 929. For example, the controller 170 can determine whether the user input is an input for volume up adjustment by a volume control key or a touch based user gesture, or a play input by the play/stop button by the media content player.

If the user input is not an input for volume control by the volume up (No of operation 929), the controller 170 can play the media content in a state in which the volume "0" is maintained in response to the user input at operation 933. For example, if the user input is detected through the play/stop button of the media content player, the controller 170 can play the media content in response to the user input. At this time, the controller 170 can play the media content silently by the volume value "0" as the volume value is set to "0" in the previous operation. Further, the controller 170 can control the performance of the operation after resuming the play of the media content with no sound at operation 935. According to an embodiment of the present disclosure, the controller 170 can adjust the volume in response to the user input of the volume up.

If the user input is an input for volume control by the volume up (Yes of operation 929), the controller 170 can play the media content while increasing the volume value in response to the user input at operation 931. For example, if the user input of increasing the volume is detected through the volume control key or the touch based user gesture, the controller 170 can control the play of the media content while increasing the volume value in response to the user input. Further, the controller 170 can control the performance of a corresponding operation after resuming the play of the media content by the increased volume at operation 935. According to an embodiment of the present disclosure, the controller 170 can perform operation of adjusting the volume until the user input of increasing the volume is cancelled, and can maintain the play of the media content based on the volume which is set at the time of cancellation of the user input.

Further, according to various embodiments of the present disclosure, each module can be configured with software, firmware, hardware, or a combination thereof. Further, the partial or entire module is configured with one entity, and can be configured to perform the function of each corresponding module in the same manner. Further, according to various embodiments of the present disclosure, each operation can be performed sequentially, repeatedly, or in parallel. Further, some operations can be omitted, and other operations can be added.

The foregoing various embodiments of the present disclosure can be implemented in an executable program command form by various computer means and be recorded in a non-volatile computer readable recording medium. In this case, the non-volatile computer readable recording medium can include a program command, a data file, and a data structure individually or a combination thereof. In the meantime, the program command recorded in the non-volatile computer readable recording medium can be specially designed or configured for the present disclosure or be known to a person having ordinary skill in a computer software field to be used. The non-volatile computer readable recording medium includes magnetic media such as a hard disk, a floppy disk, a magnetic tape, or any other similar and/or suitable magnetic media, optical media such as a Compact Disc Read Only Memory (CD-ROM), a Digital Versatile Disc (DVD), or any other similar and/or suitable optical media, a magneto-optical media such as a floptical disk or any other similar and/or suitable magneto-optical media, and a hardware device such as a ROM, RAM, flash memory, or any other similar and/or suitable hardware device. Further, the program command includes a machine language code created by a compiler and a high-level language code executable by a computer using an interpreter. The foregoing hardware device can be configured to be operated as at least one software module to perform an operation of the present disclosure, or software modules can be configured to be operated according to the hardware device.

As described above according to the method and apparatus for processing the function of the user device which is suggested in the present disclosure, the play-related function (e.g., a pause, a stop, etc.) can be simultaneously operated in response to the volume control of the media content which are being played in the user device. According to the present disclosure, the media content, which are being played, can be automatically, paused in response to the user input which sets the volume to zero, and the media content can be automatically played in response to the user input which increases the volume in the volume turn-off state.

Hence, according to the present disclosure, the user can conveniently operate the function of the user device as the second function of the user device can be simultaneously controllable according to the user input which controls the first function of the user device. For example, the user can easily and quickly adjust the volume and operate a pause by the user's single input when attempting to stop the play of the media content, and, at the same time, set the volume to zero, if necessary, while viewing/listening to the media content.

Furthermore, when attempting to stop the play of media content in the standby screen, etc., the user can stop the play of media content or immediately play the media content by using the volume control key. Furthermore, the user can easily and quickly stop the media content through the volume down operation by using the volume control key, if necessary, even in a situation when a touch lock is executed while viewing the media content. Accordingly, the user can easily stop the media content while viewing/listening to the media content by streaming through a network, and thus the data usage used at the time of streaming as well as power consumption can be decreased, and an unnecessary charge for data communication can be decreased.

Hence, according to the present disclosure, by implementing the optimal environment for supporting the multi-function which simultaneously controls the volume and play in the user device, the convenience of the user and developer can be enhanced, and the user device's usability, convenience, and competitiveness can be enhanced. The present disclosure can be implemented by various devices which may support the multi-function control according to various embodiments of the present disclosure as well as all forms of user devices such as a mobile communication terminal, a smartphone, a tablet PC, and a PDA.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for operating a user device, the method comprising:
    playing a media content on a screen;
    detecting a user input on the screen for lowering a volume of the media content, and decreasing the volume of the media content in response to the user input;
    instantly performing a pause of the media content in response to the user input for lowering the volume of the media content reaching a play control zone;
    setting the volume of the media content to zero in response to an entrance by the user input into a volume turn-off section; and
    pausing the media content in response to the entrance by the user input of the volume turn-off section into the play control zone,
    wherein the play control zone is included in at least one section which is lower than the volume turn-off section for setting the volume of the media content to be zero.

2. The method of claim 1, wherein the user input for lowering volume comprises a drag of a volume control key or a touch-based user gesture.

3. The method of claim 1, wherein the play control zone is a section for controlling a specific function for playing the media content.

4. The method of claim 1, further comprising:
    sensing a user input for increasing the volume in a pause state of the media content;
    adjusting up the volume of the media content; and
    controlling the play of the media content in response to the user input.

5. The method of claim 4, wherein the user input of raising the volume comprises a drag of a volume control key or a touch-based user gesture.

6. The method of claim 1, further comprising:
    sensing a user input by a play/stop button in a pause state of the media content; and
    playing the media content in a status in which volume turn-off setting of the media content is maintained in response to the user input.

7. The method of claim 1, wherein performing the pause comprises:
    displaying a silent stop icon in a certain area of a screen when pausing the media content in response to the user input of the volume down.

8. A method of processing a function of a user device, the method comprising:
    playing a media content on a screen;
    adjusting a volume of the media content in response to a user input on the screen for adjusting the volume;
    instantly controlling a preset play function of the media content in response to the user input for adjusting the volume of the media content reaching a play control zone;
    setting the volume of the media content to zero in response to an entrance by the user input into a volume turn-off section; and
    pausing the media content in response to the entrance by user input of the volume turn-off section into the play control zone,
    wherein the play control zone is included in at least one section of which is lower than the volume turn-off section for setting the volume of the media content to be zero.

9. A user device comprising:
    a touch screen configured to display a screen according to a play of a media content and receive a user input for controlling a volume of the media content;
    a controller configured to decrease the volume of the media content in response to a user input for decreasing the volume during playing of the media content, and instantly perform a pause of the media content in response to the user input for decreasing the volume of the media content reaching a play control zone; and;
    and
    a function processor configured to, set the volume of the media content to zero in response to an entrance by the user input to a volume turn-off section and pause the media content in response to the entrance by the user input of the volume turn-off section into the play control zone,
    wherein the play control zone is included in at least one section which is lower than the volume turn-off section for setting the volume of the media content to be zero.

10. The user device of claim 9, wherein the controller comprises:
    a content player configured to play the media content in response to an execution of the media content, and display a screen of the played media content;
    a volume controller configured to adjust output sound volume of the media content in response to the user input; and
    a function processor configured to control a play function of the media content in response to the user input of adjusting the volume.

11. The user device of claim 10, wherein the content player is configured to play the media content in response to the user input for raising the volume in a status in which the media content is paused by the volume down.

12. The user device of claim 9, wherein the user device comprises a user input unit configured to receive a first user input for execution of the media content, and receive a second user input for volume control within a volume control zone during a play of the media content.

13. A user device comprising:
- a computer-implemented content player configured to play a media content in response to execution of the media content and display a screen of the played media content;
- a computer-implemented volume controller configured to adjust a volume of the media content in response to a user input on the screen; and
- a computer-implemented function processor configured to control a play function of the media content instantly in response to the user input for adjusting the volume of the media content reaching a play control zone, and set the volume of the media content to zero in response to an entrance by the user input to a volume turn-off section and pause the media content in response to the entrance by the user input of the volume turn-off section into the play control zone,
- wherein the play control zone is included in at least one section which is lower than the volume turn-off section for setting the volume of the media content to be zero.

14. A non-transitory computer-readable recording medium having recorded a program that, when executed by one or more processors, causes the one or more processors to perform acts comprising:
- playing a media content in response to execution of a media content;
- displaying the played media content over a screen;
- adjusting a volume of the media content in response to a user input on the screen;
- instantly performing a preset play function of the media content in response to the user input for adjusting the volume of the media content reaching a play control zone; and
- setting the volume of the media content to zero in response to an entrance by the user input to a volume turn-off section, and pause the media content in response to the entrance by user input of the volume turn-off section into the play control zone,
- wherein the play control zone is included in at least one section which is lower than the volume turn-off section for setting the volume of the media content to be zero.

* * * * *